US012652472B2

(12) United States Patent
Nakamizo

(10) Patent No.: US 12,652,472 B2
(45) Date of Patent: Jun. 9, 2026

(54) IMAGING APPARATUS AND ELECTRONIC DEVICE

(71) Applicant: SONY SEMICONDUCTOR SOLUTIONS CORPORATION, Kanagawa (JP)

(72) Inventor: Masahiko Nakamizo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 926 days.

(21) Appl. No.: 17/910,272

(22) PCT Filed: Mar. 16, 2021

(86) PCT No.: PCT/JP2021/010674
§ 371 (c)(1),
(2) Date: Apr. 3, 2023

(87) PCT Pub. No.: WO2021/193254
PCT Pub. Date: Sep. 30, 2021

(65) Prior Publication Data
US 2023/0232125 A1 Jul. 20, 2023

(30) Foreign Application Priority Data
Mar. 27, 2020 (JP) ................................ 2020-059006

(51) Int. Cl.
*H04N 25/13* (2023.01)
*G03B 17/02* (2021.01)
(Continued)

(52) U.S. Cl.
CPC ............. *H04N 25/13* (2023.01); *G03B 17/02* (2013.01); *H04N 25/41* (2023.01); *H10F 39/807* (2025.01)

(58) Field of Classification Search
CPC ........ H04N 25/13; H04N 25/41; G03B 17/02; H10F 39/807; H10F 39/199;
(Continued)

(56) References Cited

U.S. PATENT DOCUMENTS

| 12,068,340 | B2 * | 8/2024 | Moon | ................... H10F 39/199 |
| 2008/0218669 | A1 * | 9/2008 | Nishimura | ........ G02F 1/133512 |
| | | | | 349/110 |

(Continued)

FOREIGN PATENT DOCUMENTS

| JP | 2015-216186 | 12/2015 |
| JP | 2016-031993 | 3/2016 |

(Continued)

OTHER PUBLICATIONS

International Search Report and Written Opinion prepared by the Japan Patent Office on May 31, 2021, for International Application No. PCT/JP2021/010674, 3 pgs.

*Primary Examiner* — Jarrett J Stark
(74) *Attorney, Agent, or Firm* — SHERIDAN ROSS P.C.

(57) ABSTRACT

An imaging apparatus including: a first imaging element and a second imaging element, in which each of the first and second imaging elements includes: a plurality of pixels in a semiconductor substrate; a pixel separation wall; and a color filter above a light receiving surface of the semiconductor substrate that transmits light having a wavelength that is different between the first imaging element and the second imaging element, the pixel separation wall included in the first imaging element has a slit at a center of the first imaging element where the imaging apparatus is viewed from a side of the light receiving surface, and the pixel separation wall included in the second imaging element does not have a slit (Continued)

at a center of the second imaging element where the imaging apparatus is viewed from a side of the light receiving surface.

18 Claims, 18 Drawing Sheets

(51) Int. Cl.
H04N 25/40 (2023.01)
H10F 39/00 (2025.01)

(58) Field of Classification Search
CPC .............. H10F 39/182; H10F 39/8063; H10F 39/8023; H10F 39/8053
See application file for complete search history.

(56) References Cited

U.S. PATENT DOCUMENTS

| | | | | |
|---|---|---|---|---|
| 2017/0345853 | A1* | 11/2017 | Kato | ........................ G02B 7/34 |
| 2018/0047768 | A1 | 2/2018 | Suzuki et al. | |
| 2018/0350856 | A1 | 12/2018 | Masagaki et al. | |
| 2019/0051685 | A1 | 2/2019 | Handa et al. | |
| 2020/0235149 | A1 | 7/2020 | Shiraishi et al. | |
| 2023/0143387 | A1* | 5/2023 | Matsumoto | ......... H10F 39/8063 |
| | | | | 257/432 |
| 2025/0160026 | A1* | 5/2025 | Yoo | ........................ H10F 39/014 |
| 2025/0221074 | A1* | 7/2025 | Kim | .................... H10F 39/8063 |
| 2025/0228020 | A1* | 7/2025 | Shiraishi | ............... H10F 39/806 |

FOREIGN PATENT DOCUMENTS

| | | | | |
|---|---|---|---|---|
| JP | 2017-212351 | | 11/2017 | |
| JP | 2017212351 | A * | 11/2017 | .......... H04N 25/704 |
| JP | 2018-029170 | | 2/2018 | |
| JP | 2018-142739 | | 9/2018 | |
| JP | 2018-201015 | | 12/2018 | |
| JP | 2019-033195 | | 2/2019 | |
| JP | 2019-165136 | | 9/2019 | |
| WO | WO 2017/130723 | | 8/2017 | |
| WO | WO-2017130723 | A1 * | 8/2017 | .......... H04N 25/778 |

* cited by examiner

IMAGING APPARATUS AND ELECTRONIC DEVICE

CROSS REFERENCE TO RELATED APPLICATIONS

This application is a national stage application under 35 U.S.C. 371 and claims the benefit of PCT Application No. PCT/JP2021/010674, having an international filing date of 16 Mar. 2021, which designated the United States, which PCT application claimed the benefit of Japanese Patent Application No. 2020-059006, filed 27 Mar. 2020, the entire disclosures of each of which are incorporated herein by reference.

TECHNICAL FIELD

The present disclosure relates to an imaging apparatus and an electronic device.

BACKGROUND ART

These days, in an imaging apparatus, a technique in which a phase difference is detected by using a pair of adjacent phase difference detection pixels is employed as an autofocus function. Examples of such a technique include imaging elements disclosed in Patent Documents 1 to 3 below.

CITATION LIST

Patent Document

Patent Document 1: Japanese Patent Application Laid-Open No. 2018-201015
Patent Document 2: Japanese Patent Application Laid-Open No. 2017-212351
Patent Document 3: Japanese Patent Application Laid-Open No. 2015-216186

SUMMARY OF THE INVENTION

Problems to be Solved by the Invention

However, in the technologies disclosed in Patent Documents 1 and 2 above, it is difficult to completely prevent the inflow of charge to an adjacent phase difference detection pixel, and hence there is a limit to further improving the accuracy of phase difference detection. Further, in the technology disclosed in Patent Document 3 above, although the inflow of charge like that described above can be avoided, in a case where light of a long wavelength is incident on the imaging element, the light is likely to be irregularly reflected by a separation wall that separates pixels, and hence cross-talk between adjacent pixels is likely to occur and degradation of a captured image may be caused.

Thus, the present disclosure proposes an imaging apparatus and an electronic device capable of avoiding degradation of a captured image while improving the accuracy of phase difference detection.

Solutions to Problems

According to the present disclosure, there is provided an imaging apparatus including: a first imaging element and a second imaging element each of which converts light to a charge, in which each of the first and second imaging elements includes: a plurality of pixels that is provided in a semiconductor substrate and is adjacent to each other; a pixel separation wall that separates adjacent ones of the plurality of pixels; and a color filter that is provided above a light receiving surface of the semiconductor substrate and transmits light having a wavelength that is different between the first imaging element and the second imaging element, the pixel separation wall included in the first imaging element has a slit at a center of the first imaging element in a case where the imaging apparatus is viewed from a side of the light receiving surface, and the pixel separation wall included in the second imaging element does not have a slit at a center of the second imaging element in a case where the imaging apparatus is viewed from a side of the light receiving surface.

Furthermore, according to the present disclosure, there is provided an electronic device including: an imaging apparatus including a first imaging element and a second imaging element each of which converts light to a charge, in which each of the first and second imaging elements includes: a plurality of pixels that is provided in a semiconductor substrate and is adjacent to each other; a pixel separation wall that separates adjacent ones of the plurality of pixels; and a color filter that is provided above a light receiving surface of the semiconductor substrate and transmits light having a wavelength that is different between the first imaging element and the second imaging element, the pixel separation wall included in the first imaging element has a slit at a center of the first imaging element in a case where the imaging apparatus is viewed from a side of the light receiving surface, and the pixel separation wall included in the second imaging element does not have a slit at a center of the second imaging element in a case where the imaging apparatus is viewed from a side of the light receiving surface.

BRIEF DESCRIPTION OF DRAWINGS

FIG. 19 is a block diagram showing an example of a schematic functional configuration of a smartphone.

FIG. 22 is a block diagram depicting an example of schematic configuration of a vehicle control system.

MODE FOR CARRYING OUT THE INVENTION

Figure 1:
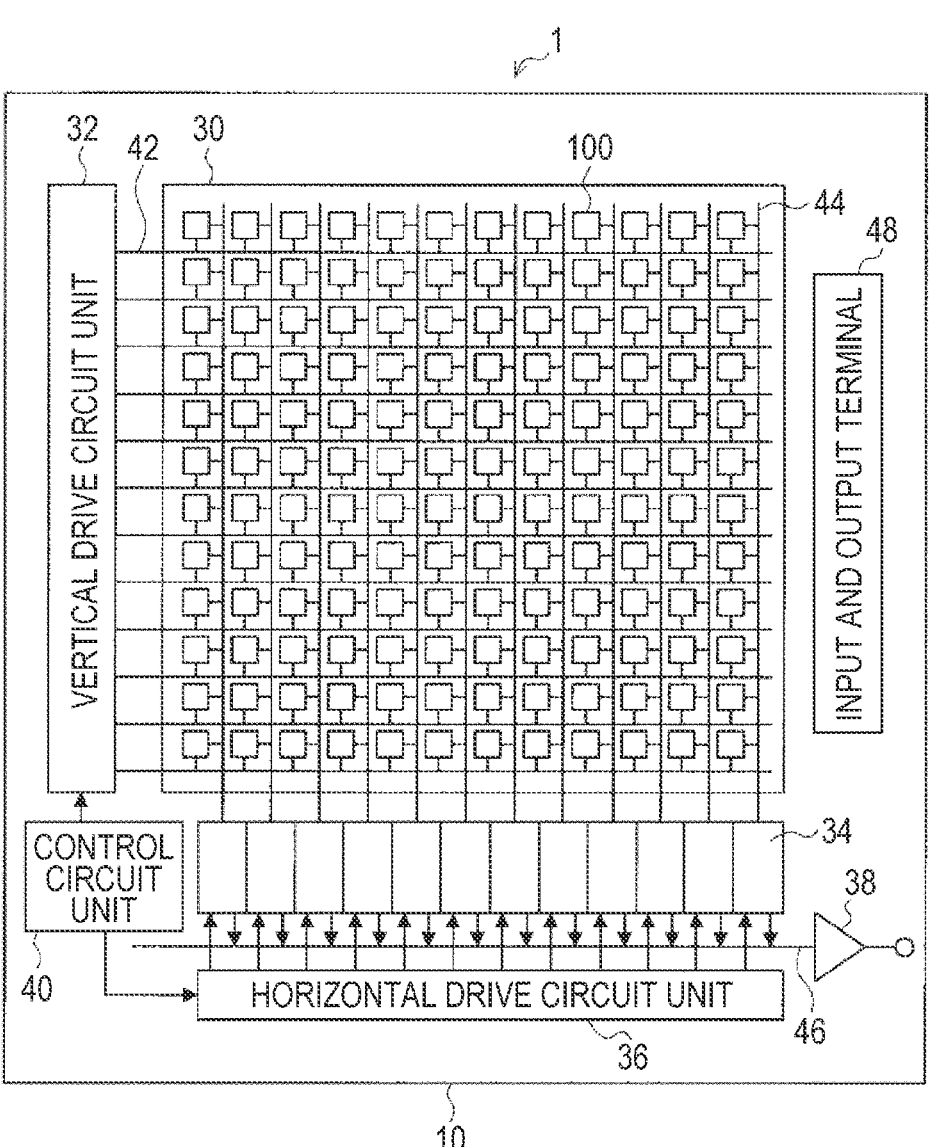
FIG. 1 is an explanatory diagram showing a planar configuration example of an imaging apparatus 1 according to an embodiment of the present disclosure.

Embodiments of the present disclosure will be described below in detail with reference to the drawings. In each of the following embodiments, the same parts are denoted by the same reference symbols, and a repetitive description thereof will be omitted.

Note that, in the present specification and the drawings, a plurality of structural elements that has substantially the same or similar function and structure is sometimes distinguished from each other using different numbers after the same reference sign. However, in a case where there is no need in particular to distinguish the plurality of structural elements that has substantially the same or similar function and structure, the same reference sign alone is attached. Further, there are cases in which similar structural elements of different embodiments are distinguished by adding the same reference numeral followed by different letters. However, in a case where it is not necessary to particularly distinguish each of similar structural element, only the same reference signs are attached.

Further, the drawings referred to in the following description are drawings for promoting the description and understanding of an embodiment of the present disclosure, and the shapes, dimensions, ratios, etc. shown in the drawings may be different from the actual ones for the sake of clarity.

Further, the imaging apparatus shown in the drawings may be modified in design with consideration of the following description and known technology, as appropriate. Further, in the description using a cross-sectional view of the imaging apparatus, the up-down direction of the stacked structure of the imaging apparatus corresponds to a relative direction in a case where a light receiving surface that light incident on the imaging apparatus enters is assumed to be the upside, and may be different from the up-down direction according to the actual gravitational acceleration.

The dimensions expressed in the following description mean not only mathematically or geometrically defined dimensions but also dimensions including a difference (error or distortion) to an allowable extent in the operation of the imaging apparatus and the manufacturing process of the imaging apparatus. Further, "substantially the same" used for specific dimensions in the following description means not only a case of being mathematically or geometrically completely matched but also a case of having a difference (error or distortion) to an allowable extent in the operation of the imaging apparatus and the manufacturing process of the imaging apparatus.

Further, in the following description, "electrically connect" means that a plurality of elements is directly connected or is indirectly connected via another element.

Further, in the following description, "sharing" means that mutually different elements (for example, pixels or the like) use another element (for example, an on-chip lens or the like) together.

Note that the description is given in the following order.
1. Schematic Configuration of Imaging Apparatus
   2. Schematic Configuration of Imaging Element According to Comparative Example
   3. Background in Which Present Inventor has Created Embodiment According to Present Disclosure
4. First Embodiment
   4.1 Planar Configuration
   4.2 Cross-Sectional Configuration
   4.3 Modification Examples
5. Second Embodiment
   6. Third Embodiment
   6.1 Planar Configuration
   6.2 Cross-Sectional Configuration
   6.3 Modification Examples
7. Fourth Embodiment
   8. Fifth Embodiment
   8.1 Planar Configuration
   8.2 Cross-sectional Configuration
   8.3 Modification Example
9. Sixth Embodiment
10. Seventh Embodiment
11. Eighth Embodiment
12. Summary
13. Application Example to Camera
14. Application Example to Smartphone
15. Application Example to Endoscopic Surgery System
16. Application Example to Mobile Body
17. Supplements

1. SCHEMATIC CONFIGURATION OF IMAGING APPARATUS

First, a schematic configuration of an imaging apparatus 1 according to an embodiment of the present disclosure is described with reference to FIG. 1. FIG. 1 is an explanatory diagram showing a planar configuration example of an imaging apparatus 1 according to an embodiment of the present disclosure. As shown in FIG. 1, the imaging apparatus 1 according to an embodiment of the present disclosure includes, on a semiconductor substrate 10 containing, for example, silicon, a pixel array section (light receiving section) 30 in which a plurality of imaging elements 100 is arranged in a matrix form and a peripheral circuit unit provided to surround the pixel array section 30. Further, the imaging apparatus 1 includes, as the peripheral circuit unit, a vertical drive circuit unit 32, a column signal processing circuit unit 34, a horizontal drive circuit unit 36, an output circuit unit 38, a control circuit unit 40, etc. Hereinbelow, details of each block of the imaging apparatus 1 are described.

(Pixel Array Section 30)

The pixel array section 30 includes, on the semiconductor substrate 10, a plurality of imaging elements 100 two-dimensionally arranged in a matrix form along the row direction and the column direction. Each imaging element 100 includes a photoelectric conversion section (illustration omitted) and a plurality of pixel transistors (for example, metal-oxide-semiconductor (MOS) transistors) (illustration omitted). Specifically, the pixel transistors include, for example, four MOS transistors of a transfer transistor, a selection transistor, a reset transistor, and an amplification transistor. Note that in the pixel array section 30, a plurality of imaging elements 100 is two-dimensionally arranged in a Bayer array, for example. Here, the Bayer array is an array pattern in which imaging elements 100 each of which absorbs light having a green wavelength (for example, a wavelength of 495 nm to 570 nm) and generates a charge are arranged in a checkered pattern, and in the remaining portion, imaging elements 100 each of which absorbs light having a red wavelength (for example, a wavelength of 620 nm to 750 nm) and generates a charge and imaging elements 100 each of which absorbs light having a blue wavelength (for example, a wavelength of 450 nm to 495 nm) and generates a charge are alternately arranged on a line basis. Further, a detailed structure of the imaging element 100 is described later.

(Vertical Drive Circuit Unit 32)

The vertical drive circuit unit 32 includes, for example, a shift register; and selects a pixel drive wiring 42, supplies a pulse for driving the imaging element 100 to the selected pixel drive wiring 42, and drives the imaging element 100 in units of rows. That is, the vertical drive circuit unit 32 selectively scans each imaging element 100 of the pixel array section 30 in a sequential manner in the vertical direction (the up-down direction in FIG. 1) in units of rows, and supplies a pixel signal based on a signal charge generated in accordance with the amount of light received by a photoelectric conversion section (illustration omitted) of each imaging element 100 to the column signal processing circuit unit 34 described later through a vertical signal line 44.

(Column Signal Processing Circuit Unit 34)

The column signal processing circuit unit 34 is provided for each column of imaging elements 100, and performs signal processing such as noise removal on pixel signals outputted from imaging elements 100 of one row, on a pixel column basis. For example, the column signal processing circuit unit 34 performs signal processing such as correlated double sampling (CDS) and analog-digital (AD) conversion in order to remove pixel-specific fixed pattern noise.

(Horizontal Drive Circuit Unit 36)

The horizontal drive circuit unit 36 includes, for example, a shift register; and sequentially outputs horizontal scanning pulses, thus successively selects the sections of the column signal processing circuit unit 34 described above, and causes each section of the column signal processing circuit unit 34 to output a pixel signal to a horizontal signal line 46.

(Output Circuit Unit 38)

The output circuit unit 38 performs signal processing on pixel signals sequentially supplied from the sections of the column signal processing circuit unit 34 described above through the horizontal signal line 46, and outputs the results. The output circuit unit 38 may function as, for example, a functional section that performs buffering, or may perform processing such as black level adjustment, column variation correction, or various pieces of digital signal processing. Note that the buffering refers to temporarily storing pixel signals at the time of pixel signal exchange in order to compensate differences in processing speed and transfer speed. Further, an input and output terminal 48 is a terminal for exchanging signals with an external apparatus.

(Control Circuit Unit 40)

The control circuit unit 40 receives an input clock and data that gives commands of an operating mode, etc., and outputs data such as inside information of the imaging apparatus 1. That is, the control circuit unit 40 generates clock signals and control signals serving as standards of the operations of the vertical drive circuit unit 32, the column signal processing circuit unit 34, the horizontal drive circuit unit 36, etc. on the basis of a vertical synchronizing signal, a horizontal synchronizing signal, and a master clock. Then, the control circuit unit 40 outputs the generated clock signals and control signals to the vertical drive circuit unit 32, the column signal processing circuit unit 34, the horizontal drive circuit unit 36, etc.

2. SCHEMATIC CONFIGURATION OF IMAGING ELEMENT ACCORDING TO COMPARATIVE EXAMPLE

Meanwhile, in order to further improve the autofocus function while avoiding degradation of a captured image, that is, in order to improve the accuracy of phase difference detection, the present inventor was making extensive studies on providing phase difference detection pixels on the entire surface of the pixel array section 30 of the imaging apparatus 1 (all-pixel phase difference detection). Under such circumstances, it has been studied to provide, on the entire surface of the pixel array section 30, imaging elements 100a each of which functions as one imaging element at the time of imaging and functions as two phase difference detection pixels at the time of phase difference detection (a dual photodiode structure).

Figures 2, 3:
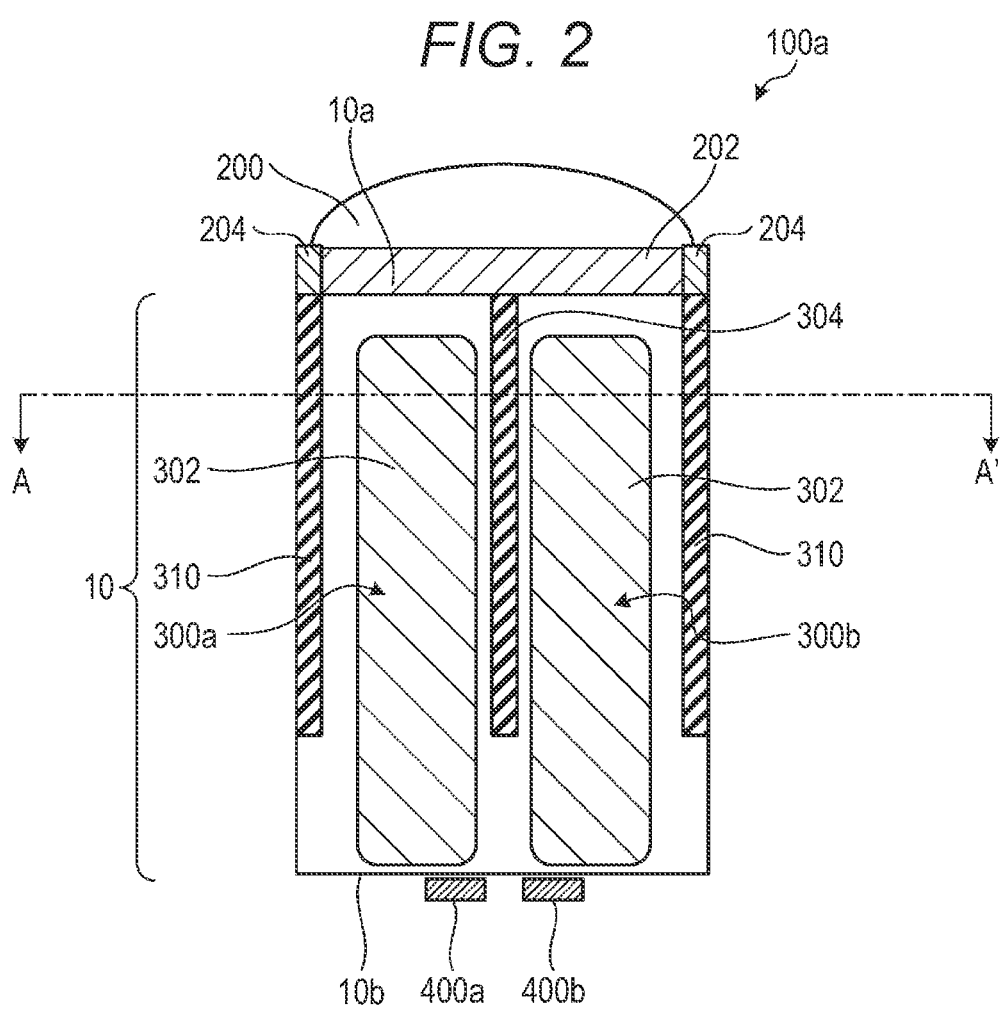
FIG. 2 is an explanatory diagram showing part of a cross section of an imaging element 100a according to a comparative example.
FIG. 3 is an explanatory diagram showing a planar configuration of imaging elements 100a according to the comparative example.

Thus, before describing details of the imaging element 100 according to an embodiment of the present disclosure, a schematic configuration of an imaging element 100a according to a comparative example that the present inventor studied first is described with reference to FIG. 2. FIG. 2 is an explanatory diagram showing part of a cross section of an imaging element 100a according to a comparative example, and specifically corresponds to a cross section of the imaging element 100a taken along the thickness direction of the semiconductor substrate 10. Note that, here, as described above, the comparative example means an imaging element that the present inventor extensively studied before making the embodiment of the present disclosure.

A plurality of imaging elements 100a according to the comparative example is provided on the semiconductor substrate 10 to be adjacent to each other. Then, as shown in FIG. 2, the imaging element 100a includes an on-chip lens 200, a color filter 202, a light blocking section 204, a semiconductor substrate 10, and transfer gates 400a and 400b. Further, the imaging element 100a includes pixels 300a and 300b provided in the semiconductor substrate 10 and each having a photoelectric conversion section 302, a pixel separation wall 304 that separates these pixels 300a and 300b, and an element separation wall 310 that surrounds the two pixels 300a and 300b. Hereinbelow, a stacked structure of the imaging element 100a according to the comparative example is described; the following description is given in order from the upper side (the light receiving surface 10a side) to the lower side in FIG. 2.

As shown in FIG. 2, the imaging element 100a includes one on-chip lens 200 that is provided above the light receiving surface 10a of the semiconductor substrate 10 and condenses incident light on the photoelectric conversion section 302 described later.

Then, incident light condensed by the on-chip lens 200 is incident on the photoelectric conversion sections 302 of the two pixels 300a and 300b via the color filter 202 provided below the on-chip lens 200. The color filter 202 is any of a color filter that transmits a red wavelength component, a color filter that transmits a green wavelength component, and a color filter that transmits a blue wavelength component.

Further, the light blocking section 204 is provided on the light receiving surface 10a of the semiconductor substrate 10 so as to surround the color filter 202. The light blocking section 204 is provided between adjacent imaging elements 100a to perform light blocking between the adjacent imaging elements 100a.

Further, for example, in a semiconductor substrate 10 of a second conductivity type (for example, a P-type), two photoelectric conversion sections 302 each containing an impurity of a first conductivity type (for example, an N-type) are provided individually for pixels 300a and 300b. The photoelectric conversion section 302 absorbs light having a red wavelength component, a green wavelength component, or a blue wavelength component incident via the color filter 202, and generates a charge.

In the imaging element 100a, the photoelectric conversion section 302 of pixel 300a and the photoelectric conversion section 302 of pixel 300b function as two phase difference detection pixels at the time of phase difference detection.

Specifically, in the photoelectric conversion section 302, the amount of charge generated, that is, the sensitivity varies depending on the angle of incidence of light with respect to the optical axis of the photoelectric conversion section 302 itself (an axis perpendicular to the light receiving surface). For example, the photoelectric conversion section 302 has the highest sensitivity in a case where the angle of incidence is 0 degrees, and further the sensitivity of the photoelectric conversion section 302 has, with the angle of incidence, a line-symmetric relationship of which the object axis is 0 degrees in terms of the angle of incidence. Therefore, light from the same point is incident on the photoelectric conversion section 302 of pixel 300a and the photoelectric conversion section 302 of pixel 300b at different angles of incidence, and these photoelectric conversion sections 302 generate amounts of charge according to the angles of incidence; hence, a shift (phase difference) occurs between the detected images. That is, the phase difference can be detected by detecting a difference between pixel signals based on the amounts of charge generated in the photoelectric conversion section 302 of pixel 300a and the photoelectric conversion section 302 of pixel 300b. Thus, autofocus can be achieved by a process in which such a difference (phase difference) between pixel signals is, for example, detected as a differential signal in a detection section (illustration omitted) of the output circuit unit 38, the amount of defocus is calculated on the basis of the detected phase difference, and an imaging lens (illustration omitted) is adjusted (moved).

Further, in the comparative example, pixels 300a and 300b each having the photoelectric conversion section 302 are physically separated by the pixel separation wall 304. The pixel separation wall 304 includes rear deep trench isolation (RDTI). The RDTI is formed by forming a trench penetrating from the light receiving surface 10a (back surface) side of the semiconductor substrate 10 to an intermediate place of the semiconductor substrate 10 along the thickness direction of the semiconductor substrate 10 and filling the trench with a material including an oxide film or a metal film. Note that in the imaging element 100a, the accuracy of phase difference detection is degraded in a case where at the time of phase difference detection, pixel signals outputted by the two pixels 300a and 300b (specifically, the photoelectric conversion sections 302) are mixed with each other and color mixing occurs. Thus, in the imaging element 100a, in order to further improve the accuracy of phase difference detection, the pixel separation wall 304 is required to separate the two pixels 300a and 300b to prevent color mixing.

Further, as described above, in the imaging element 100a, the photoelectric conversion section 302 of pixel 300a and the photoelectric conversion section 302 of pixel 300b function as the photoelectric conversion section 302 of one imaging element 100a at the time of normal imaging.

Further, in the semiconductor substrate 10, the element separation wall 310 that surrounds the two pixels 300a and 300b included in the imaging element 100a and physically separates adjacent imaging elements 100a is provided. The element separation wall 310 includes, for example, RDTI.

Further, charges generated in the photoelectric conversion section 302 of pixel 300a and the photoelectric conversion section 302 of pixel 300b are transferred via the transfer gates 400a and 400b provided on the front surface 10b located on the opposite side to the light receiving surface 10a of the semiconductor substrate 10. Then, the charges may be accumulated in, for example, a floating diffusion section (charge accumulation section) (illustration omitted) provided in a semiconductor region having a first conductivity type (for example, an N-type) provided in the semiconductor substrate 10. Further, a plurality of pixel transistors (illustration omitted) for transferring a charge and reading out a charge as a pixel signal may be provided on the front surface 10b of the semiconductor substrate 10.

3. BACKGROUND IN WHICH PRESENT INVENTOR HAS CREATED EMBODIMENT ACCORDING TO PRESENT DISCLOSURE

Next, before describing details of an embodiment according to the present disclosure, the background in which the present inventor has created the embodiment according to the present disclosure is described with reference to FIG. 3. FIG. 3 is an explanatory diagram showing a planar configuration of imaging elements 100a according to the comparative example, and specifically corresponds to a cross section of the imaging element 100a taken along line A-A' shown in FIG. 2.

As described above, in all-pixel phase difference detection, which the present inventor was making studies on, the suppression of mixing of outputs of the two pixels 300a and

300*b* at the time of phase difference detection is required in order to improve the accuracy of phase difference detection.

Thus, in Patent Document 1 above, as shown in FIG. 3, two protrusions 304 that protrude from the element separation wall 310 toward the center of the imaging element 100 along the column direction and face each other are provided between the two pixels 300*a* and 300*b* included in each imaging element 100*a*. In Patent Document 1 above, by providing such protrusions 304, a charge generated in the photoelectric conversion section 302 of one of the two pixels 300*a* and 300*b* can be prevented from flowing into the other pixel at the time of phase difference detection, and therefore mixing of outputs can be avoided. As a result, in Patent Document 1 above, the accuracy of phase difference detection is improved, and the occurrence of point defects on a captured image due to variations in charge inflow can be suppressed.

Further, in Patent Document 2 above, two separation sections serving as potential barriers that have mutually different potentials for a charge generated in the photoelectric conversion section are provided between two pixels included in each imaging element. In Patent Document 2 above, by providing such separation sections, mixing of outputs of the two pixels can be avoided at the time of phase difference detection, and thus the accuracy of phase difference detection is improved.

Further, in Patent Document 3 above, an insulating layer (illustration omitted) embedded in a substrate is provided between two pixels included in each imaging element. In Patent Document 3 above, by providing such an insulating layer, mixing of outputs of the two pixels can be avoided at the time of phase difference detection, and thus the accuracy of phase difference detection is improved.

However, a study by the present inventor shows that in the technologies disclosed in Patent Documents 1 and 2 above, it is difficult to completely prevent the inflow of charge to an adjacent pixel and hence there is a limit to improving the accuracy of phase difference detection. Further, in the technology disclosed in Patent Document 3 above, although such inflow of charge can be avoided, in a case where light of a long wavelength is incident on the imaging element, the light is likely to be irregularly reflected by the insulating layer provided between the two pixels. As a result, in Patent Document 3 above, crosstalk between adjacent imaging elements is likely to occur, and degradation of a captured image is caused.

Thus, in view of such circumstances, the present inventor, with attention on the characteristics of light incident on the imaging element 100, has created an embodiment according to the present disclosure capable of avoiding degradation of a captured image while improving the accuracy of phase difference detection.

Specifically, focusing attention on the characteristics of light for different wavelength regions, green light has a short wavelength, and hence in a case where such light is incident on the imaging element, the light is absorbed by the photoelectric conversion section in the vicinity of the surface of the semiconductor substrate. Therefore, it is presumed that even if a pixel separation wall is provided between the two pixels, the light is less likely to be irregularly reflected by the pixel separation wall and crosstalk is less likely to occur. On the other hand, red light has a long wavelength, and hence in a case where such light is incident on the imaging element, the light is less likely to be absorbed by the photoelectric conversion section in the vicinity of the surface of the semiconductor substrate. Therefore, it is presumed that if a pixel separation wall is provided between the two pixels, the light is irregularly reflected by the pixel separation wall and is incident on an adjacent imaging element, and crosstalk is likely to occur. Thus, the present inventor, with attention on such characteristics of light, has created an embodiment according to the present disclosure.

Figure 4:
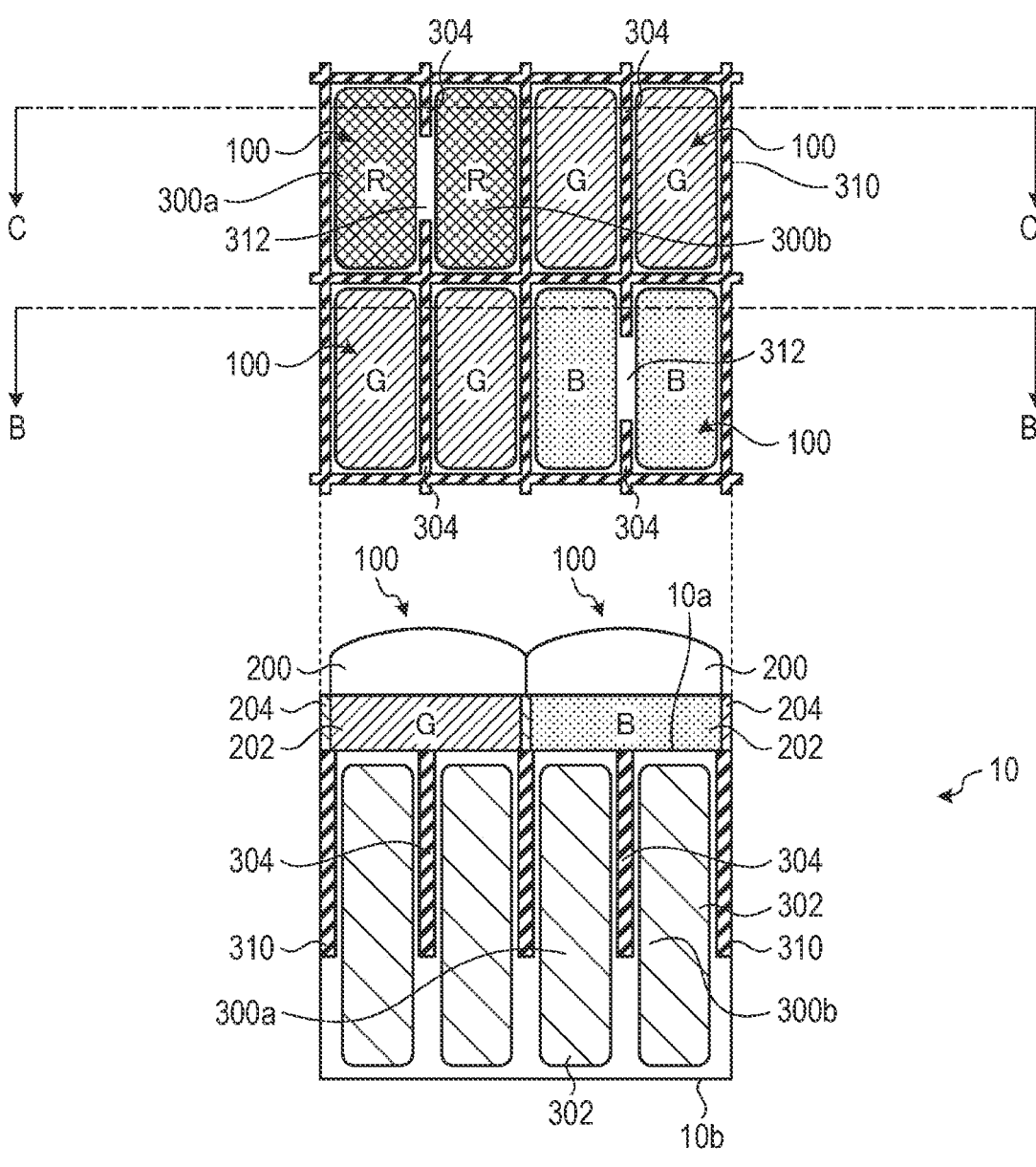
FIG. 4 is an explanatory diagram showing a configuration example of imaging elements 100 according to a first embodiment of the present disclosure.

Specifically, in an embodiment of the present disclosure created by the present inventor, in an imaging element (first imaging element) 100 that absorbs light having a red wavelength component and generates a charge, in a case where the imaging element 100 is viewed from the light receiving surface 10*a* side, a slit 312 is provided in a portion in the vicinity of the center of the imaging element 100 of the pixel separation wall 304 that separates the two pixels 300*a* and 300*b* (see FIG. 4). By thus providing the slit 312 in the vicinity of the center of the imaging element 100, an event where light incident on the vicinity of the center of the imaging element 100 is irregularly reflected by the pixel separation wall 304 and is incident on an adjacent imaging element 100 can be suppressed. As a result, in the embodiment of the present disclosure, crosstalk can be avoided, and eventually degradation of a captured image can be suppressed.

In addition, in the embodiment of the present disclosure created by the present inventor, it is presumed that in an imaging element (second imaging element) 100 that absorbs light having a green wavelength component and generates a charge, irregular reflection like that described above is less likely to occur; hence, in a case where the imaging element 100 is viewed from the light receiving surface 10*a* side, the slit 312 is not provided in the pixel separation wall 304 that separates the two pixels 300*a* and 300*b* (see FIG. 4). By means of the pixel separation wall 304 not provided with the slit 312, an event where a charge generated in the photoelectric conversion section 302 of one of the two pixels 300*a* and 300*b* flows into the other pixel can be suppressed, and hence the separation ratio of pixels 300*a* and 300*b* can be improved. Therefore, in the embodiment of the present disclosure, the accuracy of phase difference detection is improved, and the occurrence of point defects on a captured image due to variations in charge inflow can be suppressed.

That is, in the embodiment of the present disclosure created by the present inventor, degradation of a captured image can be avoided while the accuracy of phase difference detection is improved. Hereinbelow, details of embodiments according to the present disclosure are described in order.

4. FIRST EMBODIMENT

4.1 Planar Configuration

First, a planar configuration of imaging elements 100 according to a first embodiment of the present disclosure is described with reference to FIG. 4. FIG. 4 is an explanatory diagram showing a configuration example of imaging elements 100 according to the present embodiment; specifically, the diagram shown in the upper part of FIG. 4 corresponds to a cross section of the imaging element 100 taken along line A-A' shown in FIG. 2, and the diagram shown in the lower part of FIG. 4 corresponds to a cross section of the imaging element 100 taken along line B-B' shown in the upper part of FIG. 4.

As shown in the upper part of FIG. 4, in the present embodiment, mutually adjacent two rectangular pixels 300*a* and 300*b* included in one imaging element 100 are separated by a pixel separation wall 304 formed integrally with the element separation wall 310. Further, in the present embodiment, in each of the imaging elements (first imaging element and third imaging element) 100 that absorb light having a red wavelength component and light having a blue wavelength component and generate charges, the slit 312 is provided in a portion in the vicinity of the center of the imaging element 100 of the pixel separation wall 304 in a case where the imaging element 100 is viewed from the light receiving surface 10a side. In other words, the element separation wall 310 of each of the imaging elements 100 that absorb red light and blue light has two protrusions 304 that protrude along the column direction toward the center of the imaging element 100 and face each other in a case where the imaging element 100 is viewed from above the light receiving surface 10a. Note that in the present embodiment, the length of the slit 312 along the vertical direction in FIG. 4 is not particularly limited. Further, in the present embodiment, the position of the slit 312 is not limited to the center of the imaging element 100, and may be shifted by a predetermined distance from the center of the imaging element 100, for example.

In the present embodiment, in each of the imaging elements (first imaging element and third imaging element) 100 that absorb red light and blue light and generate charges, by providing the slit 312 in the vicinity of the center of the imaging element 100, an event where light incident on the vicinity of the center of the imaging element 100 is irregularly reflected by the pixel separation wall 304 and is incident on an adjacent imaging element 100 can be suppressed. As a result, in the present embodiment, crosstalk can be avoided, and eventually degradation of a captured image can be suppressed.

On the other hand, in the present embodiment, in the imaging element (second imaging element) 100 that absorbs light having a green wavelength component and generates a charge, the slit 312 is not provided in the pixel separation wall 304 in a case where the imaging element 100 is viewed from the light receiving surface 10a side.

In the present embodiment, in the imaging element (second imaging element) 100 that absorbs light having a green wavelength component and generates a charge, by means of the pixel separation wall 304 not provided with the slit 312, an event where a charge generated in the photoelectric conversion section 302 of one of the two pixels 300a and 300b flows into the other pixel can be suppressed, and hence the separation ratio of pixels 300a and 300b can be improved. As a result, in the present embodiment, in the imaging element 100 that absorbs light having a green wavelength component, the accuracy of phase difference detection is improved, and the occurrence of point defects on a captured image due to variations in charge inflow can be suppressed. In particular, since mainly the imaging element 100 that absorbs green light is used at the time of phase difference detection, the improvement of the accuracy of phase difference detection in the imaging element 100 is favorable.

That is, in the present embodiment, by a configuration in which pixel separation walls 304 having forms according to the difference in characteristics of light due to the difference in wavelength are provided individually for imaging elements 100, degradation of a captured image can be avoided while the accuracy of phase difference detection is improved.

Further, in the present embodiment, like in the comparative example, the element separation wall 310 that surrounds the two pixels 300a and 300b included in each imaging element 100 and physically separates adjacent imaging elements 100 is provided. Note that although in the upper part of FIG. 4 the widths of the element separation wall 310 and the pixel separation wall 304 are substantially the same, in the present invention the widths are not limited thereto.

4.2 Cross-Sectional Configuration

Next, a cross-sectional configuration of imaging elements 100 according to the first embodiment of the present disclosure is described with reference to the diagram shown in the lower part of FIG. 4. As shown in the lower part of FIG. 4, the imaging element 100 according to the present embodiment includes, like in the comparative example, an on-chip lens 200, a color filter 202, a light blocking section (light blocking film) 204, a semiconductor substrate 10, and transfer gates 400a and 400b. Further, in the present embodiment, the imaging element 100 includes pixels 300a and 300b provided in the semiconductor substrate 10 and each having a photoelectric conversion section 302, a pixel separation wall 304 that separates these pixels 300a and 300b, and an element separation wall 310 that surrounds the two pixels 300a and 300b included in the imaging element 100. Hereinbelow, a stacked structure of the imaging element 100 according to the present embodiment is described; the following description is given in order from the upper side (the light receiving surface 10a side) to the lower side in the diagram shown in the lower part of FIG. 4.

As shown in the lower part of FIG. 4, the imaging element 100 includes one on-chip lens 200 that is provided above the light receiving surface 10a of the semiconductor substrate 10 and condenses incident light on the photoelectric conversion section 302. Like in the comparative example, the imaging element 100 has a structure in which two pixels 300a and 300b are provided for one on-chip lens 200. That is, the on-chip lens 200 is shared by the two pixels 300a and 300b. Note that the on-chip lens 200 may include, for example, a silicon nitride film (SiN) or a resin-based material such as a styrene-based resin, an acrylic-based resin, a styrene-acrylic copolymer-based resin, or a siloxane-based resin.

Then, incident light condensed by the on-chip lens 200 is incident on the photoelectric conversion sections 302 of the two pixels 300a and 300b via the color filter 202 provided below the on-chip lens 200 and above the light receiving surface 10a. In other words, in the imaging element 100, like in the comparative example, two pixels 300a and 300b are provided for a stack of one on-chip lens 200 and one color filter 202. The color filter 202 is any of a color filter that transmits a red wavelength component, a color filter that transmits a green wavelength component, and a color filter that transmits a blue wavelength component. For example, the color filter 202 may contain, for example, a material in which a pigment or a dye is dispersed in a transparent binder such as silicone.

Further, the light blocking section 204 is provided on the light receiving surface 10a of the semiconductor substrate 10 so as to surround the color filter 202. By being provided between adjacent imaging elements 100, the light blocking section 204 suppresses crosstalk between the adjacent imaging elements 100, and performs light blocking between the adjacent imaging elements 100 in order to further improve accuracy at the time of phase difference detection. The light blocking section 204 may contain, for example, a metal material or the like containing tungsten (W), aluminum (Al), copper (Cu), titanium (Ti), molybdenum (Mo), nickel (Ni), or the like.

Further, for example, in a semiconductor substrate 10 of a second conductivity type (for example, a P-type), two photoelectric conversion sections 302 each containing an impurity of a first conductivity type (for example, an N-type) are provided individually for pixels 300a and 300b. As described above, the photoelectric conversion section 302 absorbs light having a red wavelength component, a green wavelength component, or a blue wavelength component incident via the color filter 202, and generates a charge. Then, in the present embodiment, like in the comparative example, the photoelectric conversion section 302 of pixel 300a and the photoelectric conversion section 302 of pixel 300b function as a pair of phase difference detection pixels at the time of phase difference detection. That is, in the present embodiment, the phase difference can be detected by detecting the difference between pixel signals based on the amounts of charge generated in the photoelectric conversion section 302 of pixel 300a and the photoelectric conversion section 302 of pixel 300b. Note that although the above description is given on the assumption that the phase difference is detected as a difference between pixel signals of the photoelectric conversion section 302 of pixel 300a and the photoelectric conversion section 302 of pixel 300b, the present invention is not limited thereto; for example, the phase difference may be detected as a ratio between pixel signals of the photoelectric conversion section 302 of pixel 300a and the photoelectric conversion section 302 of pixel 300b.

Further, in the present embodiment, like in the comparative example, the two rectangular pixels 300a and 300b are separated from each other by the pixel separation wall 304 that is RDTI provided to penetrate from the light receiving surface 10a to an intermediate place of the semiconductor substrate 10 along the thickness direction of the semiconductor substrate 10. As described above, the RDTI is formed by forming a trench (illustration omitted) penetrating from the light receiving surface 10a (back surface) side of the semiconductor substrate 10 to an intermediate place of the semiconductor substrate 10 along the thickness direction of the semiconductor substrate 10 and filling the trench with a material including an oxide film or a metal film such as a silicon oxide film (SiO), a silicon nitride film, amorphous silicon, polycrystalline silicon, a titanium oxide film (TiO), aluminum, or tungsten.

Further, in the present embodiment, like in the comparative example, the element separation wall 310 that surrounds the two pixels 300a and 300b included in the imaging element 100 and physically separates adjacent imaging elements 100 is provided in the semiconductor substrate 10. The element separation wall 310 is RDTI provided to penetrate from the light receiving surface 10a to an intermediate place of the semiconductor substrate 10. That is, the element separation wall 310 includes a trench (illustration omitted) that penetrates from the light receiving surface 10a (back surface) side of the semiconductor substrate 10 to an intermediate place of the semiconductor substrate 10 along the thickness direction of the semiconductor substrate 10 and a material including an oxide film or a metal film such as a silicon oxide film, a silicon nitride film, amorphous silicon, polycrystalline silicon, a titanium oxide film, aluminum, or tungsten embedded in the trench.

Note that although as shown in the lower part of FIG. 4 the depths of the pixel separation wall 304 and the element separation wall 310 from the light receiving surface 10a of the semiconductor substrate 10 are substantially the same, the present embodiment is not limited thereto.

Further, also in the present embodiment, charges generated in the photoelectric conversion section 302 of pixel 300a and the photoelectric conversion section 302 of pixel 300b are transferred via transfer gates 400a and 400b of transfer transistors (a kind of the pixel transistors described above) provided on the front surface 10b located on the opposite side to the light receiving surface 10a of the semiconductor substrate 10. Each of the transfer gates 400a and 400b may include, for example, a metal film. Then, the charges may be accumulated in, for example, a floating diffusion section (charge accumulation section) (illustration omitted) provided in a semiconductor region having a first conductivity type (for example, an N-type) provided in the semiconductor substrate 10. Note that in the present embodiment, the floating diffusion section is not limited to being provided in the semiconductor substrate 10, and may be provided in another substrate (illustration omitted) stacked on the semiconductor substrate 10, for example.

Further, a plurality of pixel transistors (illustration omitted) that is different from the transfer transistor described above and is used for readout of a charge as a pixel signal or for other purposes may be provided on the front surface 10b of the semiconductor substrate 10. Further, in the present embodiment, the pixel transistor may be provided in the semiconductor substrate 10, or may be provided in another substrate (illustration omitted) stacked on the semiconductor substrate 10.

As above, in the present embodiment, in each of the imaging elements (first imaging element and third imaging element) 100 that absorb red light and blue light, the slit 312 is provided in a portion in the vicinity of the center of the imaging element 100 of the pixel separation wall 304 that separates the two pixels 300a and 300b in a case where the imaging element 100 is viewed from the light receiving surface 10a side. Thus, in the present embodiment, in the imaging elements 100 that absorb red light and blue light and generate charges, an event where light incident on the vicinity of the center of the imaging element 100 is irregularly reflected by the pixel separation wall 304 and is incident on an adjacent imaging element 100 can be suppressed. As a result, in the present embodiment, in the imaging elements 100 that absorb red light and blue light, crosstalk can be avoided, and eventually degradation of a captured image can be suppressed.

Further, in the present embodiment, it is presumed that in the imaging element (second imaging element) 100 that absorbs green light, irregular reflection like that described above is less likely to occur; hence, in a case where the imaging element 100 is viewed from the light receiving surface 10a side, the slit 312 is not provided in the pixel separation wall 304 that separates the two pixels 300a and 300b. Thus, in the present embodiment, in the imaging element 100 that absorbs light having a green wavelength component and generates a charge, an event where a charge generated in the photoelectric conversion section 302 of one of the two pixels 300a and 300b flows into the other pixel can be suppressed, and hence the separation ratio of pixels 300a and 300b can be improved. As a result, in the present embodiment, in the imaging element 100 that absorbs light having a green wavelength component, the accuracy of phase difference detection is improved, and the occurrence of point defects on a captured image due to variations in charge inflow can be suppressed. In particular, since mainly the imaging element 100 that absorbs green light is used at the time of phase difference detection, the improvement of the accuracy of phase difference detection in the imaging element 100 is favorable.

That is, in the present embodiment, by a configuration in which pixel separation walls 304 having forms according to the difference in characteristics of light due to the difference in wavelength are provided individually for imaging elements 100, degradation of a captured image can be avoided while the accuracy of phase difference detection is improved.

4.3 Modification Examples

Figures 5, 6:
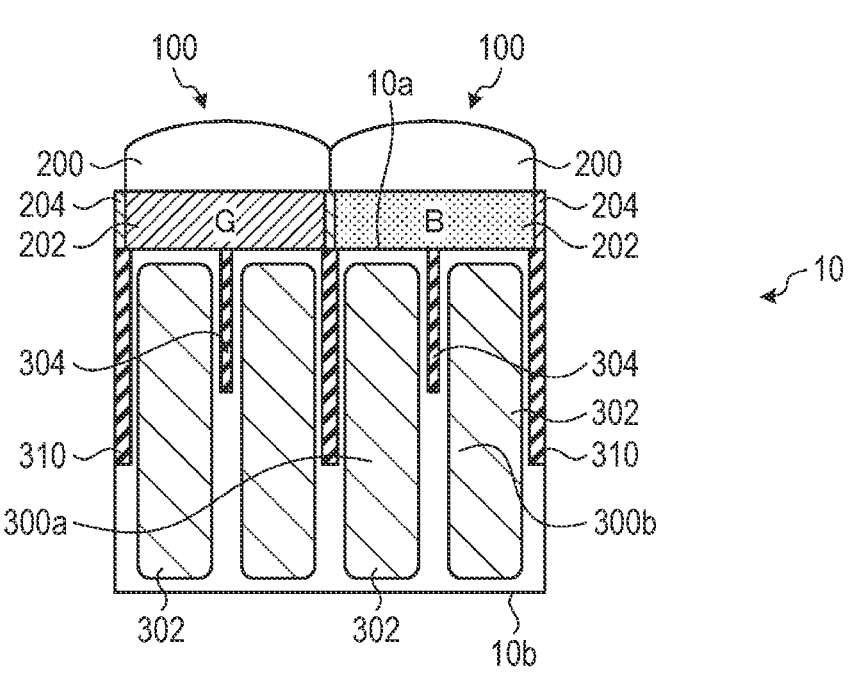
FIG. 5 is an explanatory diagram (part 1) showing a configuration example of a cross section of imaging elements 100 according to a modification example of the first embodiment of the present disclosure.
FIG. 6 is an explanatory diagram (part 2) showing a configuration example of a cross section of imaging elements 100 according to a modification example of the first embodiment of the present disclosure.
Figure 7:
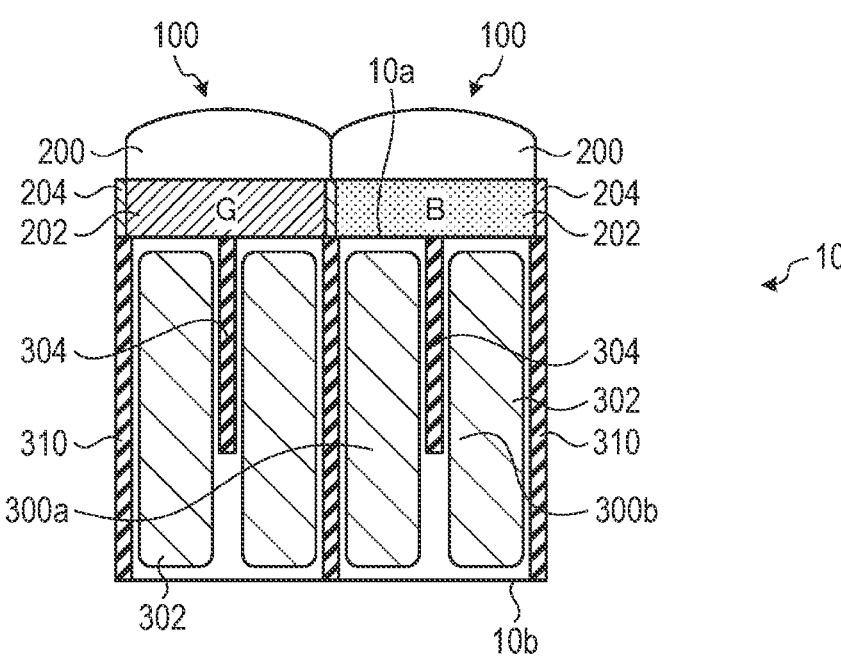
FIG. 7 is an explanatory diagram (part 3) showing a configuration example of a cross section of imaging elements 100 according to a modification example of the first embodiment of the present disclosure.

The present embodiment may be modified as follows. Thus, modification examples of the present embodiment will now be described with reference to FIG. 5 to FIG. 7. FIG. 5 to FIG. 7 are explanatory diagrams showing configuration examples of a cross section of imaging elements 100 according to modification examples of the present embodiment, and specifically correspond to a cross section of the imaging element 100 taken along line B-B' or line C-C' shown in FIG. 4.

Modification Example 1

First, modification example 1 is described with reference to FIG. 5. As shown in FIG. 5, in the present modification example 1, the depth of the pixel separation wall 304 with respect to the light receiving surface 10a may be shallower than the depth of the element separation wall 310. Further, in the present modification example, as shown in FIG. 5, the width of the pixel separation wall 304 may be thinner than the width of the element separation wall 310. In the present modification example 1, by setting the depth and width of the pixel separation wall 304 as described above, an event where light incident on the vicinity of the center of the imaging element 100 is irregularly reflected by the pixel separation wall 304 and is incident on an adjacent imaging element 100 can be suppressed; thus, crosstalk can be avoided, and eventually degradation of a captured image can be suppressed.

Modification Example 2

Next, modification example 2 is described with reference to FIG. 6. As shown in FIG. 6, in the present modification example 2, the depth of the pixel separation wall 304 of the imaging element (first imaging element) 100 that absorbs red light with respect to the light receiving surface 10a may be deeper than the depth of the pixel separation wall 304 of the imaging element (second imaging element) 100 that absorbs green light. Further, in the present modification example 2, the depth of the pixel separation wall 304 of the imaging element (third imaging element) 100 that absorbs blue light with respect to the light receiving surface 10a may be shallower than the depth of the pixel separation wall 304 of the imaging element (second imaging element) 100 that absorbs green light.

As described above, the depth with respect to the light receiving surface 10a of the region of the semiconductor substrate 10 where light is absorbed varies with the wavelength of light. Specifically, light having a longer wavelength reaches a deeper region of the semiconductor substrate 10. Therefore, for light having a longer wavelength, it is preferable to provide the pixel separation wall 304 deeper in order to suppress the occurrence of crosstalk like that described above. However, as the depth of the pixel separation wall 304 becomes deeper, the manufacturing of the imaging element 100 becomes more difficult, and the possibility of damaging the imaging element 100 at the time of manufacturing becomes higher. Then, in a case where the imaging element 100 is damaged, dark current may occur. Based on the foregoing, in the present modification example, in the imaging element 100 that absorbs red light of a long wavelength, the occurrence of crosstalk is suppressed by increasing the depth of the pixel separation wall 304 with respect to the light receiving surface 10a. Further, in the present modification example, in the imaging element 100 that absorbs blue light of a short wavelength, a reduction in yield and the occurrence of dark current are suppressed by reducing the depth of the pixel separation wall 304 with respect to the light receiving surface 10a.

Modification Example 3

Further, modification example 3 will now be described with reference to FIG. 7. As shown in FIG. 7, the element separation wall 310 may be provided to penetrate the semiconductor substrate 10 from the light receiving surface (back surface) 10a to the front surface 10b along the thickness direction of the semiconductor substrate 10. In the present modification example 3, by providing such an element separation wall 310, an event where a charge generated in the imaging element 100 (specifically, the photoelectric conversion section 302) flows out to an adjacent other imaging element 100 can be avoided, and thus the amount of charge that can be stored in the imaging element 100 can be increased.

5. SECOND EMBODIMENT

Figure 8:
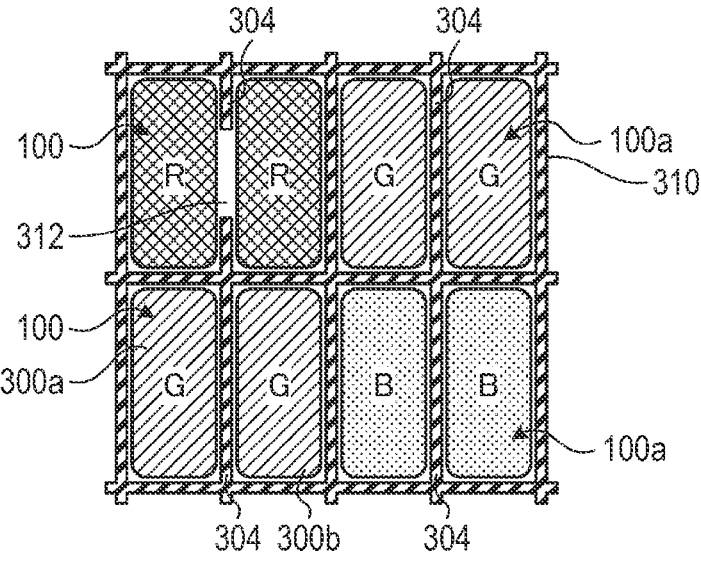
FIG. 8 is an explanatory diagram showing a planar configuration example of imaging elements 100 according to a second embodiment of the present disclosure.

Meanwhile, it is presumed that blue light, which has a wavelength shorter than the wavelength of red light, is less likely to be irregularly reflected by the pixel separation wall 304 than red light. Thus, in the imaging element (third imaging element) 100 that absorbs light having a blue wavelength component and generates a charge, the slit 312 may not be provided in the pixel separation wall 304 in a case where the imaging element 100 is viewed from the light receiving surface 10a side. Hereinbelow, such a second embodiment of the present disclosure is described with reference to FIG. 8. FIG. 8 is an explanatory diagram showing a planar configuration example of imaging elements 100 according to the present embodiment, and specifically corresponds to a cross section of the imaging element 100 taken along line A-A' shown in FIG. 2.

As shown in FIG. 8, in the present embodiment, in the imaging element (third imaging element) 100 that absorbs blue light, the slit 312 is not provided in the pixel separation wall 304 in a case where the imaging element 100 is viewed from the light receiving surface 10a side. In the present embodiment, by such a configuration, in the imaging element 100 that absorbs blue light, an event where a charge generated in the photoelectric conversion section 302 of one of the two pixels 300a and 300b flows into the other pixel can be suppressed, and the accuracy (separation ratio) of phase difference detection can be improved.

6. THIRD EMBODIMENT

Figure 9:
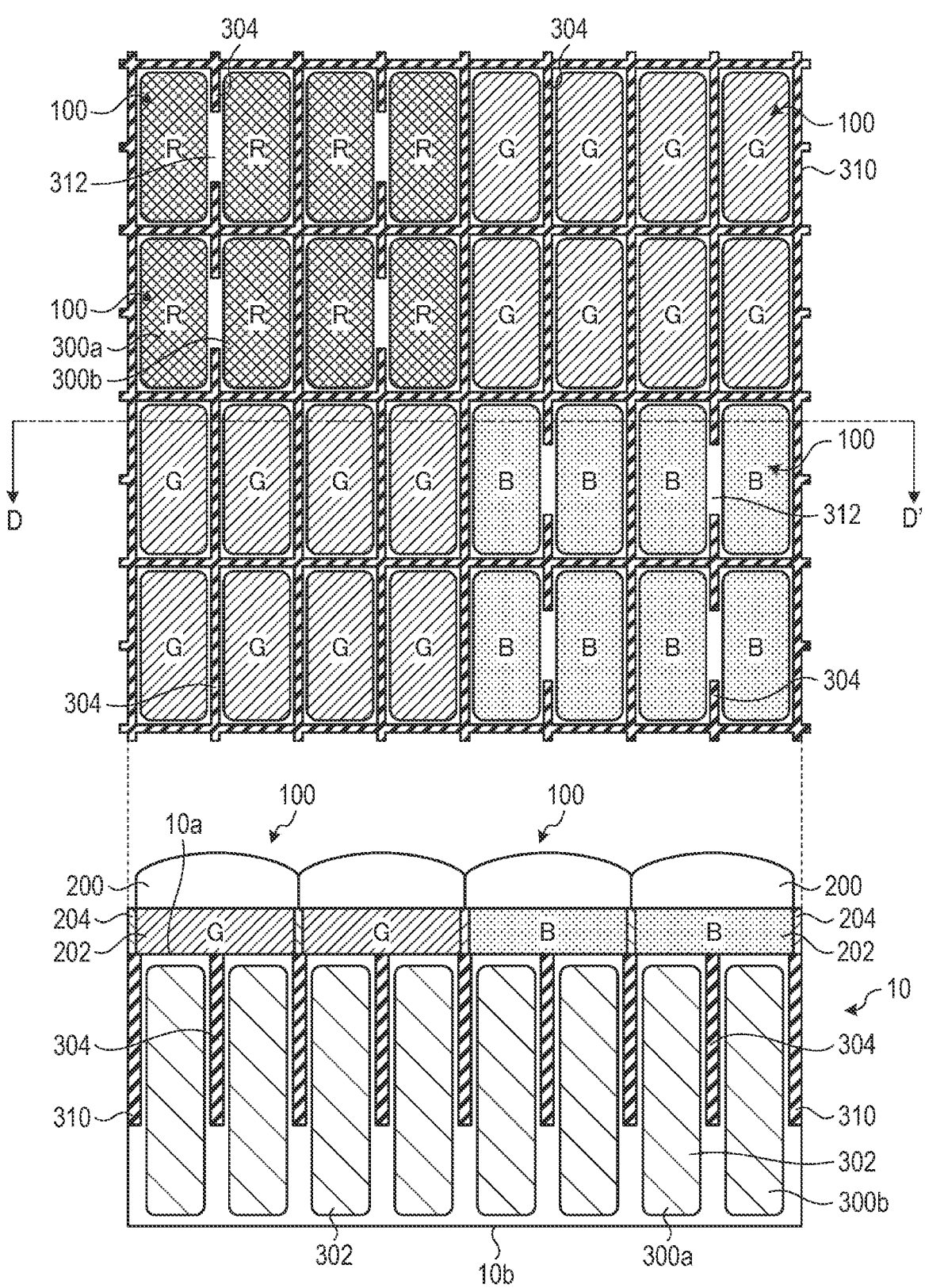
FIG. 9 is an explanatory diagram showing a configuration example of imaging elements 100 according to a third embodiment of the present disclosure.

In an embodiment of the present disclosure, imaging elements 100 that absorb light of the same color may be arranged on the semiconductor substrate 10 in units of 2×2 arrays. Thus, a third embodiment of the present disclosure having such an arrangement will now be described with reference to FIG. 9. FIG. 9 is an explanatory diagram showing a configuration example of imaging elements 100 according to the present embodiment; specifically, the diagram shown in the upper part of FIG. 9 corresponds to a cross section of the imaging element 100 taken along line A-A' shown in FIG. 2, and the diagram shown in the lower part of FIG. 9 corresponds to a cross section of the imaging element 100 taken along line D-D' shown in the upper part of FIG. 9.

6.1 Planar Configuration

First, as shown in the upper part of FIG. 9, in the present embodiment, a plurality of imaging elements 100 that absorbs light of the same color is arranged in a 2×2 configuration along the row direction and the column direction, and such four imaging elements 100 are taken as one array unit. Then, in the present embodiment, array units that absorb red light, green light, and blue light are two-dimensionally arranged in a matrix form on the semiconductor substrate 10.

Then, also in the present embodiment, like in the first embodiment, in each of the imaging elements (first imaging element and third imaging element) 100 that absorb red light and blue light, the slit 312 is provided in a portion in the vicinity of the center of the imaging element 100 of the pixel separation wall 304 in a case where the imaging element 100 is viewed from the light receiving surface 10a side. Further, also in the present embodiment, like in to the first embodiment, in the imaging element (second imaging element) 100 that absorbs green light, the slit 312 is not provided in the pixel separation wall 304 in a case where the imaging element 100 is viewed from the light receiving surface 10a side.

6.2 Cross-Sectional Configuration

A cross-sectional configuration of imaging elements 100 in the present embodiment is shown in the lower part of FIG. 9; the cross-sectional configuration is common to the first cross-sectional configuration described above, and thus a detailed description is omitted here.

6.3 Modification Example

Figure 10:
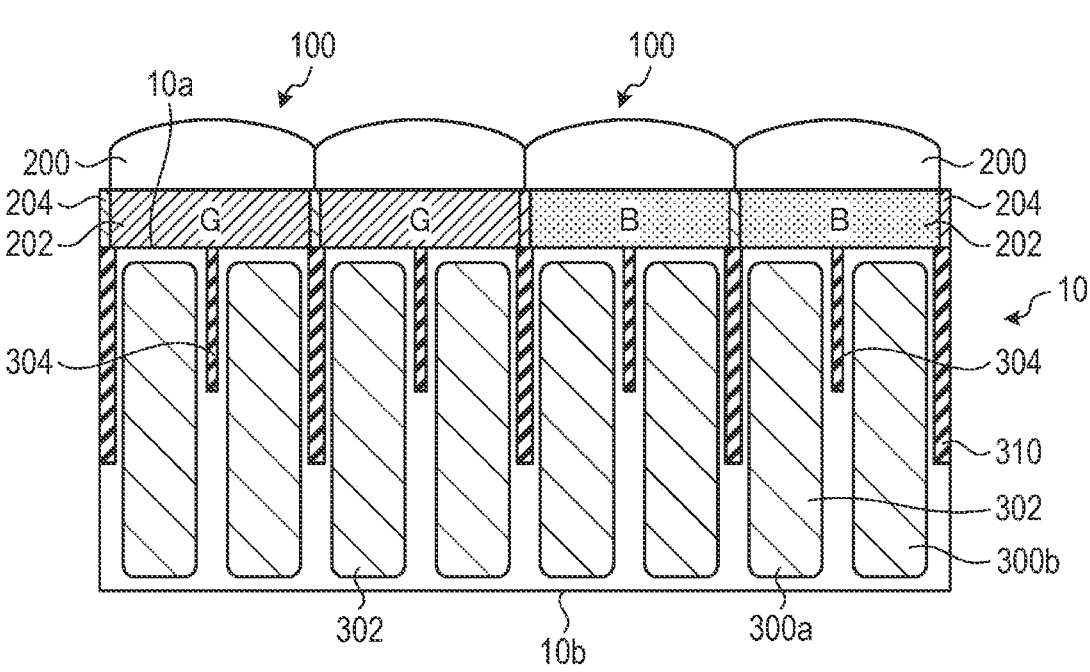
FIG. 10 is an explanatory diagram (part 1) showing a configuration example of a cross section of imaging elements 100 according to a modification example of the third embodiment of the present disclosure.
Figure 11:
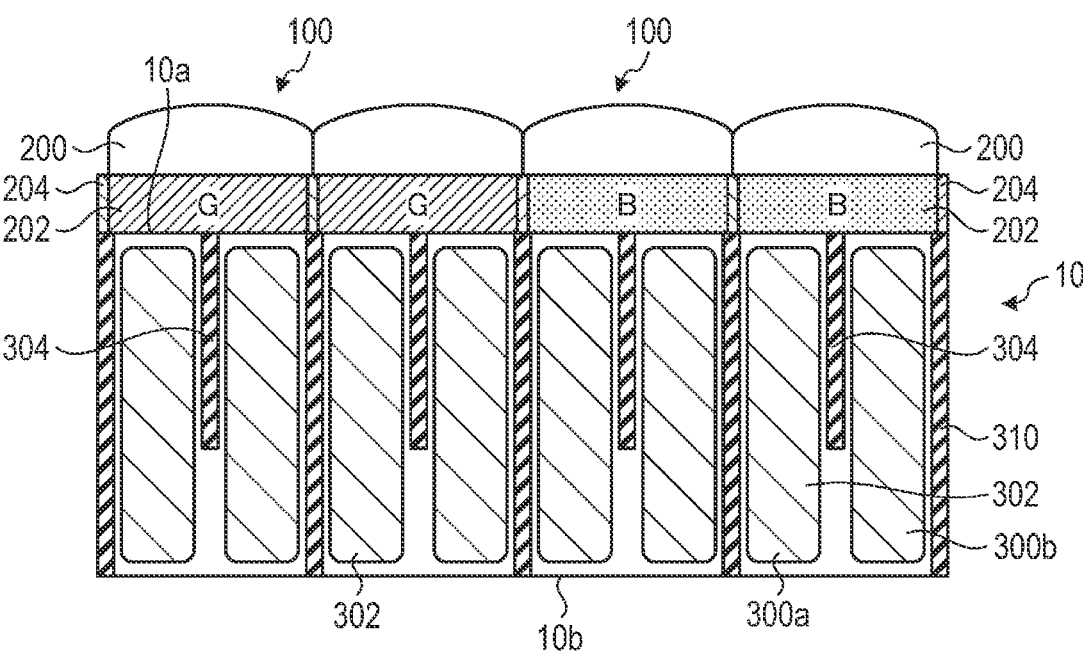
FIG. 11 is an explanatory diagram (part 2) showing a configuration example of a cross section of imaging elements 100 according to a modification example of the third embodiment of the present disclosure.

The present embodiment may be modified as follows. Thus, modification examples of the present embodiment will now be described with reference to FIG. 10 and FIG. 11. FIG. 10 and FIG. 11 are explanatory diagrams showing configuration examples of a cross section of imaging elements 100 according to modification examples of the present embodiment, and specifically correspond to a cross section of the imaging element 100 taken along line D-D' shown in FIG. 9.

Modification Example 1

First, modification example 1 is described with reference to FIG. 10. As shown in FIG. 10, in the present modification example 1, the depth of the pixel separation wall 304 with respect to the light receiving surface 10a may be shallower than the depth of the element separation wall 310. In the present modification example 1, by setting the depth of the pixel separation wall 304 as described above, an event where light incident on the vicinity of the center of the imaging element 100 is irregularly reflected by the pixel separation wall 304 and is incident on an adjacent imaging element 100 can be suppressed; thus, crosstalk can be avoided, and eventually degradation of a captured image can be suppressed.

Note that also in the present modification example, like in modification example 1 and modification example 2 of the first embodiment, the width of the pixel separation wall 304 may be thinner than the width of the element separation wall 310, or the depth of the pixel separation wall 304 with respect to the light receiving surface 10a may be varied in accordance with the wavelength of the absorbed light.

Modification Example 2

As shown in FIG. 11, the element separation wall 310 may be provided to penetrate the semiconductor substrate 10 from the light receiving surface (back surface) 10a to the front surface 10b along the thickness direction of the semiconductor substrate 10. In the present modification example 2, by providing such an element separation wall 310, an event where a charge generated in the imaging element 100 flows out to an adjacent other imaging element 100 can be avoided, and thus the amount of charge that can be stored in the imaging element 100 can be increased.

7. FOURTH EMBODIMENT

Figure 12:
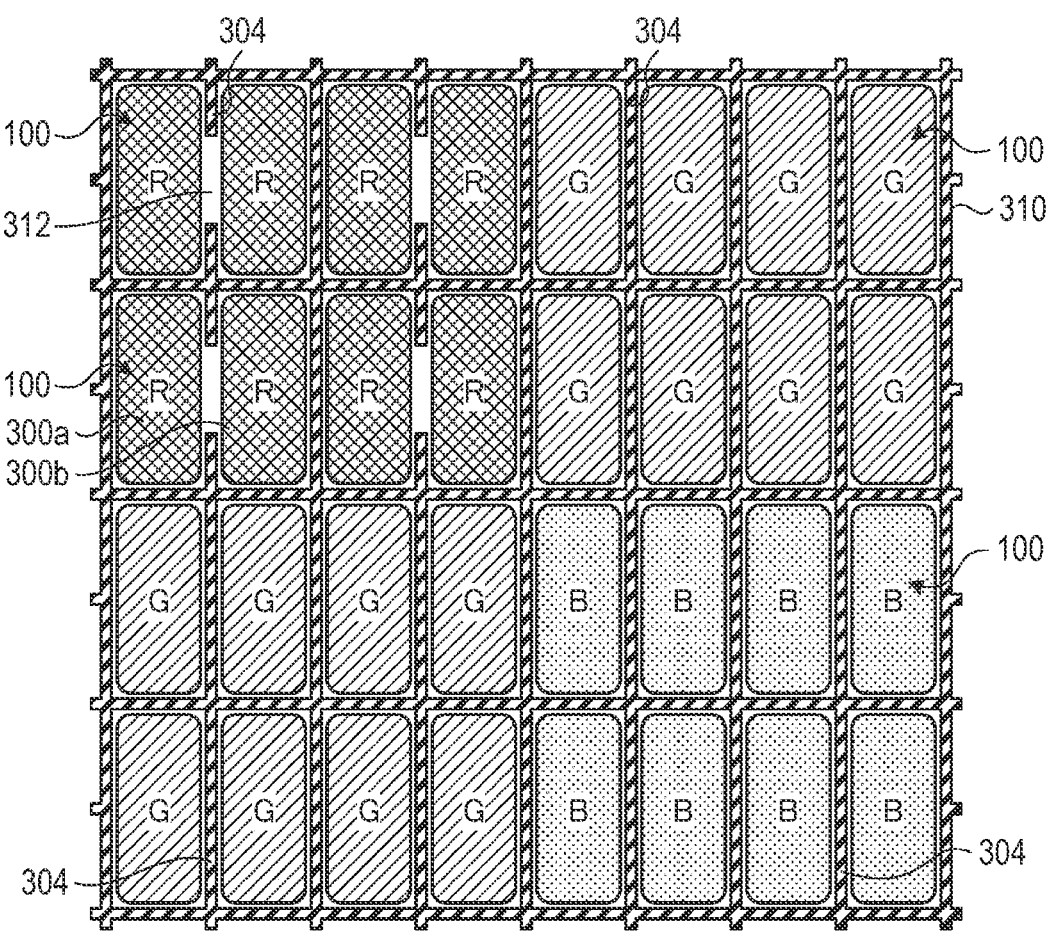
FIG. 12 is an explanatory diagram showing a planar configuration example of imaging elements 100 according to a fourth embodiment of the present disclosure.

The second embodiment described above may be applied to the third embodiment described above. That is, in the imaging element (third imaging element) 100 that absorbs light having a blue wavelength component, the slit 312 may not be provided in the pixel separation wall 304 in a case where the imaging element 100 is viewed from the light receiving surface 10a side. Hereinbelow, such a fourth embodiment of the present disclosure is described with reference to FIG. 12. FIG. 12 is an explanatory diagram showing a planar configuration example of imaging elements 100 according to the present embodiment, and specifically corresponds to a cross section of the imaging element 100 taken along line A-A' shown in FIG. 2.

As shown in FIG. 12, in the present embodiment, in the imaging element (third imaging element) 100 that absorbs blue light, the slit 312 is not provided in the pixel separation wall 304 in a case where the imaging element 100 is viewed from the light receiving surface 10a side. In the present embodiment, by such a configuration, in the imaging element 100 that absorbs blue light, an event where a charge generated in the photoelectric conversion section 302 of one of the two pixels 300a and 300b flows into the other pixel can be suppressed, and the accuracy (separation ratio) of phase difference detection can be improved.

8. FIFTH EMBODIMENT

Figure 13:
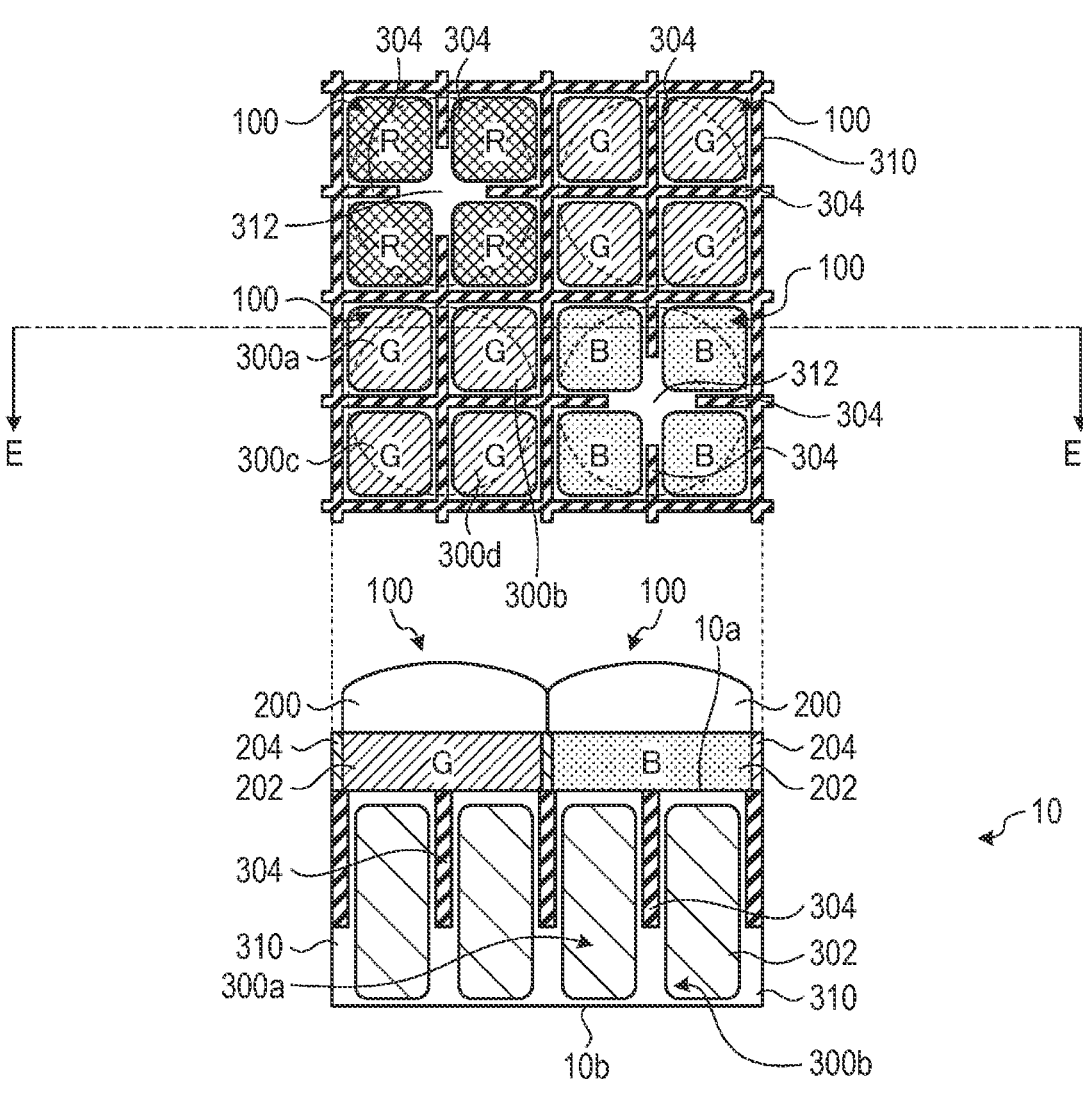
FIG. 13 is an explanatory diagram showing a configuration example of imaging elements 100 according to a fifth embodiment of the present disclosure.

In an embodiment of the present disclosure, one imaging element 100 may include four pixels 300a to 300d. Thus, a fifth embodiment of the present disclosure having such an arrangement will now be described with reference to FIG. 13. FIG. 13 is an explanatory diagram showing a configuration example of imaging elements 100 according to the present embodiment; specifically, the diagram shown in the upper part of FIG. 13 corresponds to a cross section of the imaging element 100 taken along line A-A' shown in FIG. 2, and the diagram shown in the lower part of FIG. 13 corresponds to a cross section of the imaging element 100 taken along line E-E' shown in the upper part of FIG. 13.

8.1 Planar Configuration

As shown in the upper part of FIG. 13, in the present embodiment, one imaging element 100 includes four pixels 300a to 300d divided by twos along the row direction and the column direction by the pixel separation wall 304. By using such a structure, the phase difference in the column direction can be detected by individually reading out the amounts of charge generated in the pixels 300 arranged along the column direction in the drawing, and the phase difference in the row direction can be detected by individually reading out the amounts of charge generated in the pixels 300 arranged along the row direction in the drawing.

Then, also in the present embodiment, like in the first embodiment, in each of the imaging elements (first imaging element and third imaging element) 100 that absorb red light and blue light, the slit 312 is provided in a portion in the vicinity of the center of the imaging element 100 of the pixel separation wall 304, that is, at the center of the four pixels 300*a* to 300*d* in a case where the imaging element 100 is viewed from the light receiving surface 10*a* side. Further, also in the present embodiment, like in the first embodiment, in the imaging element (second imaging element) 100 that absorbs green light, the slit 312 is not provided in the pixel separation wall 304, that is, at the center of the four pixels 300*a* to 300*d* in a case where the imaging element 100 is viewed from the light receiving surface 10*a* side. Note that the broken line in the diagram shown in the upper part of FIG. 13 indicates the on-chip lens 200, and in the present embodiment one imaging element 100 includes one on-chip lens 200.

8.2 Cross-Sectional Configuration

A cross-sectional configuration of imaging elements 100 in the present embodiment is shown in the lower part of FIG. 13; the cross-sectional configuration is common to the first cross-sectional configuration described above, and thus a detailed description is omitted here.

Note that in the present embodiment, the imaging element 100 is not limited to including four pixels 300*a* to 300*d*, and may include, for example, eight pixels 300; thus, is not particularly limited.

Further, also in the present embodiment, like in modification example 1 and modification example 2 of the first embodiment, the width of the pixel separation wall 304 may be thinner than the width of the element separation wall 310, or the depth of the pixel separation wall 304 with respect to the light receiving surface 10*a* may be varied in accordance with the wavelength of the absorbed light.

8.3 Modification Example

Figure 14:
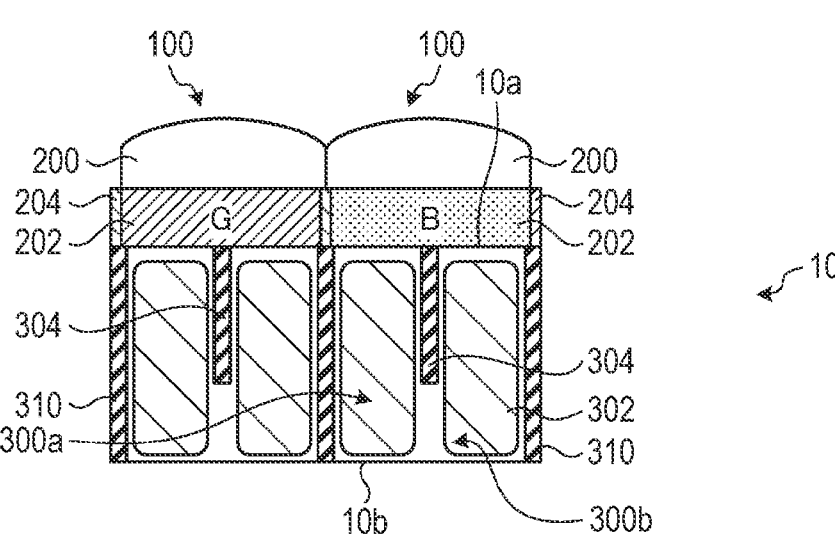
FIG. 14 is an explanatory diagram showing a cross-sectional configuration example of imaging elements 100 according to a modification example of the fifth embodiment of the present disclosure.

The present embodiment may be modified as follows. Thus, a modification example of the present embodiment will now be described with reference to FIG. 14. FIG. 14 is an explanatory diagram showing a configuration example of a cross section of imaging elements 100 according to a modification example of the present embodiment, and specifically corresponds to a cross section of the imaging element 100 taken along line E-E' shown in FIG. 13.

As shown in FIG. 14, the element separation wall 310 may be provided to penetrate the semiconductor substrate 10 from the light receiving surface (back surface) 10*a* to the front surface 10*b* along the thickness direction of the semiconductor substrate 10. In the present modification example, by providing such an element separation wall 310, an event where a charge generated in the imaging element 100 flows out to an adjacent other imaging element 100 can be avoided, and thus the amount of charge that can be stored in the imaging element 100 can be increased.

9. SIXTH EMBODIMENT

Figure 15:
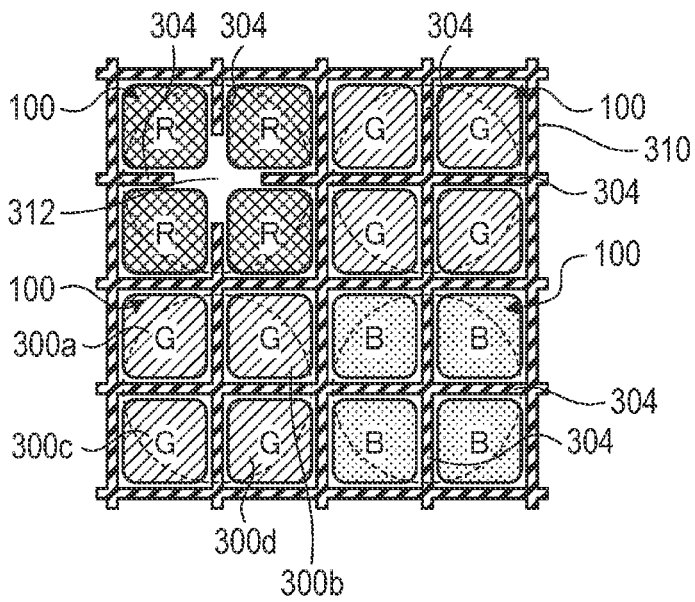
FIG. 15 is an explanatory diagram showing a planar configuration example of imaging elements 100 according to a sixth embodiment of the present disclosure.

The second embodiment described above may be applied also to the fifth embodiment described above. That is, in the imaging element (third imaging element) 100 that absorbs light having a blue wavelength component, the slit 312 may not be provided in the pixel separation wall 304 in a case where the imaging element 100 is viewed from the light receiving surface 10*a* side. Hereinbelow, such a sixth embodiment of the present disclosure is described with reference to FIG. 15. FIG. 15 is an explanatory diagram showing a planar configuration example of imaging elements 100 according to the present embodiment, and specifically corresponds to a cross section of the imaging element 100 taken along line A-A' shown in FIG. 2.

As shown in FIG. 15, in the present embodiment, in the imaging element (third imaging element) 100 that absorbs blue light, the slit 312 is not provided in the pixel separation wall 304 in a case where the imaging element 100 is viewed from the light receiving surface 10*a* side. In the present embodiment, by such a configuration, in the imaging element 100 that absorbs blue light, an event where a charge generated in the photoelectric conversion section 302 of one of the two pixels 300*a* and 300*b* flows into the other pixel can be suppressed, and the accuracy (separation ratio) of phase difference detection can be improved.

10. SEVENTH EMBODIMENT

Figure 16:
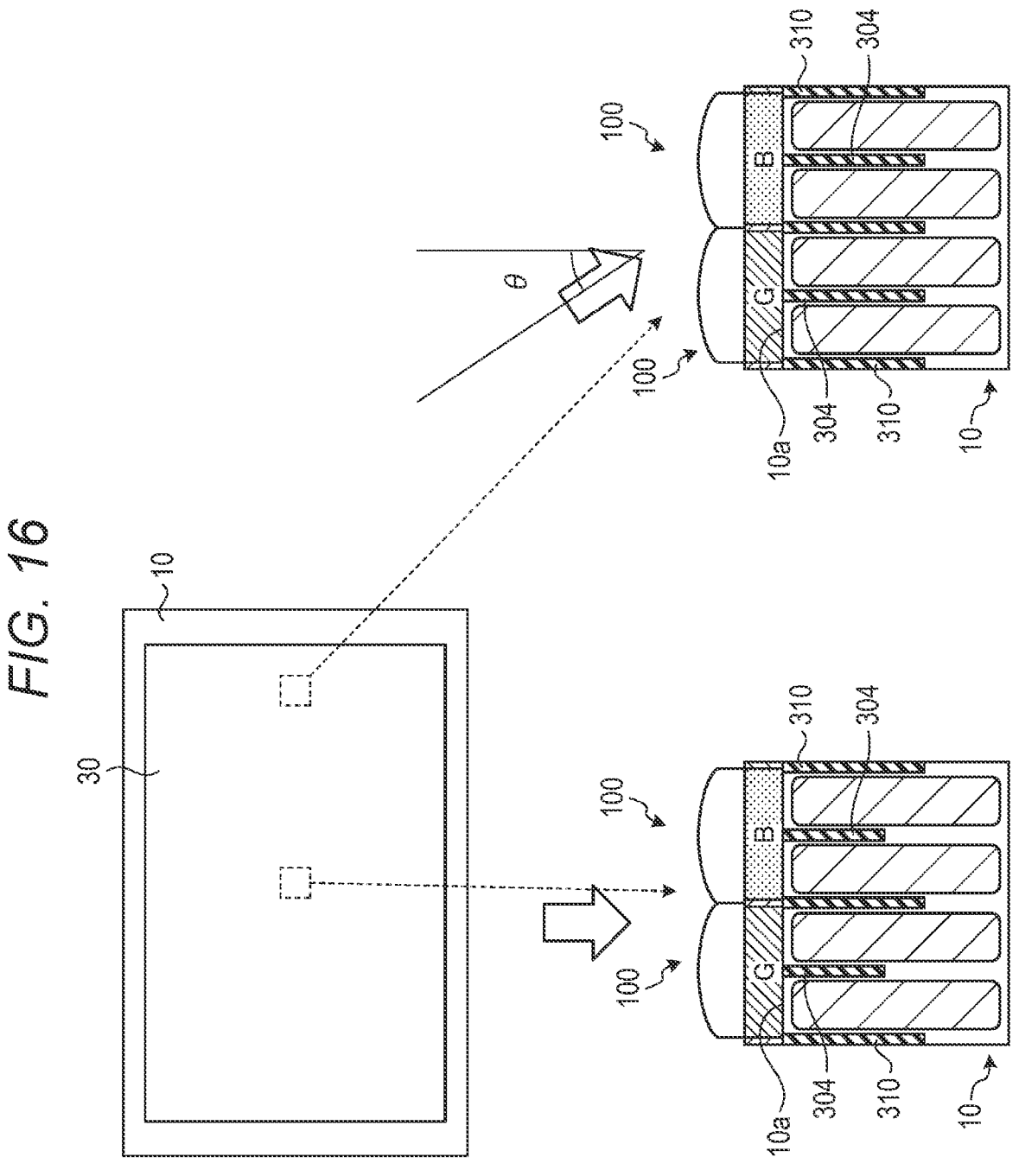
FIG. 16 is an explanatory diagram showing a configuration example of imaging elements 100 according to a seventh embodiment of the present disclosure.

Hereinbelow, a seventh embodiment of the present disclosure is described with reference to FIG. 16. FIG. 16 is an explanatory diagram showing a configuration example of imaging elements 100 according to a seventh embodiment of the present disclosure.

As shown in FIG. 16, the angle θ of incidence of light (indicated by the arrow in FIG. 16) incident on the pixel array section (light receiving section) 30 is in the neighborhood of 0 degrees in a central region of the pixel array section 30, and increases with proximity to the outer periphery of the pixel array section 30. Then, as the angle θ of incidence increases, light becomes more likely to be reflected by the surface (side surface) of the pixel separation wall 304 perpendicular to the light receiving surface 10*a*, and crosstalk becomes more likely to occur.

Thus, in the present embodiment, as shown in FIG. 16, the depth of the pixel separation wall 304 with respect to the light receiving surface 10*a* is shallowed in the imaging element 100 in the central region of the pixel array section 30, where it is less likely that crosstalk will occur in a mechanism like that described above. Further, in the present embodiment, the depth of the pixel separation wall 304 is deepened in the imaging element 100 in the outer peripheral region of the pixel array section 30, where it is highly likely that crosstalk will occur in a mechanism like that described above. In other words, in the present embodiment, the depth of the pixel separation wall 304 with respect to the light receiving surface 10*a* in the imaging element 100 in the central region is shallower than the depth of the pixel separation wall 304 in the imaging element 100 in the outer peripheral region. Thus, in the present embodiment, in the imaging element 100 in the outer peripheral region, where the angle θ of incidence is large, the occurrence of crosstalk due to the reflection of light by the surface of the pixel separation wall 304 perpendicular to the light receiving surface 10*a* can be suppressed. Further, in the present embodiment, in the imaging element 100 in the central region, where it is less likely that crosstalk will occur in a similar mechanism, a reduction in yield and the occurrence of dark current can be suppressed by reducing the depth of the pixel separation wall 304.

11. EIGHTH EMBODIMENT

Figure 17:
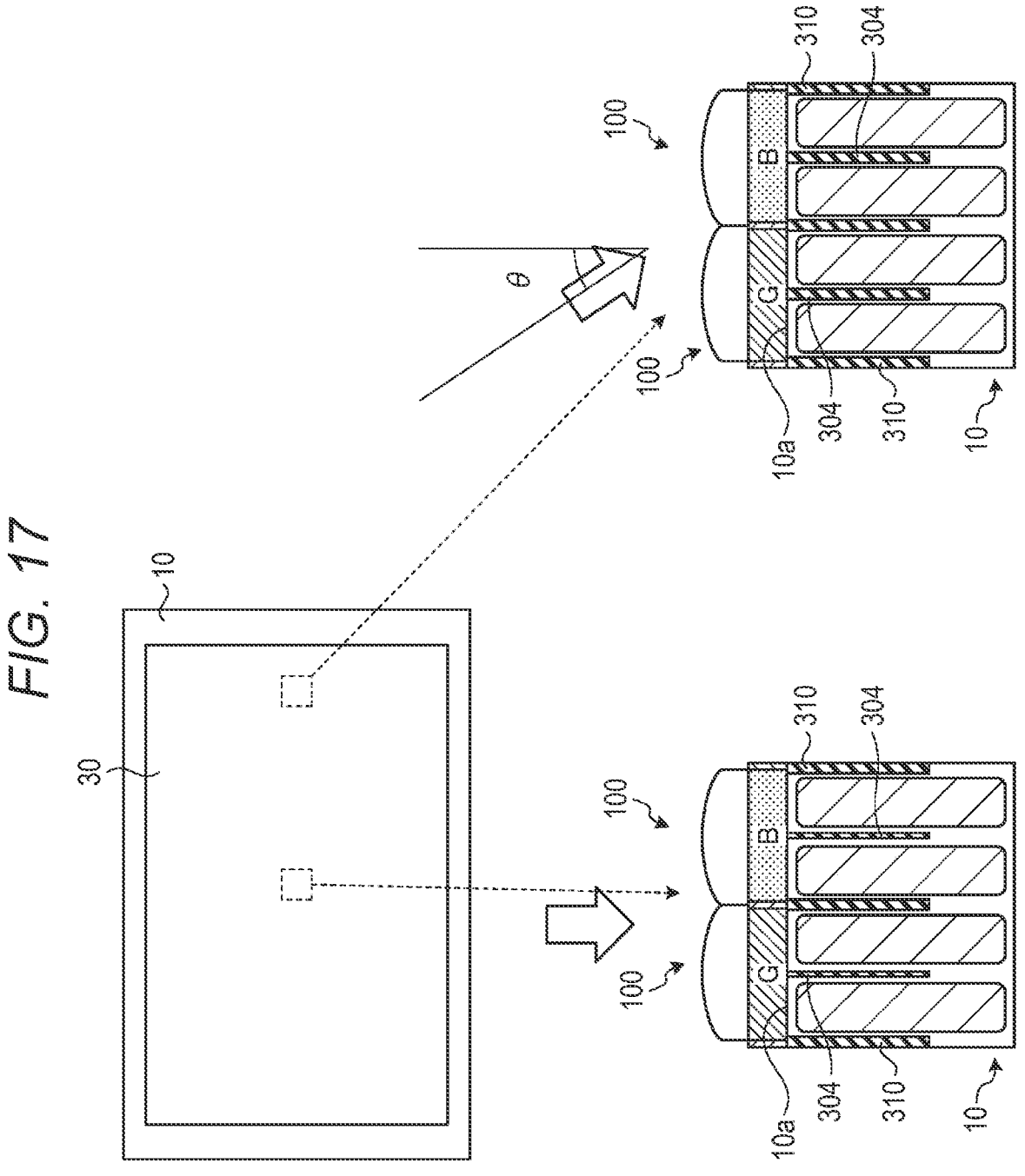
FIG. 17 is an explanatory diagram showing a configuration example of imaging elements 100 according to an eighth embodiment of the present disclosure.

Hereinbelow, a seventh embodiment of the present disclosure is described with reference to FIG. 17. FIG. 17 is an explanatory diagram showing a configuration example of imaging elements 100 according to an eighth embodiment of the present disclosure.

As described above, the angle θ of incidence of light (indicated by the arrow in FIG. 17) incident on the pixel array section (light receiving section) 30 is in the neighborhood of 0 degrees in a central region of the pixel array section 30, and increases with proximity to the outer periphery of the pixel array section 30. Then, as the angle θ of incidence decreases, light becomes more likely to be reflected by the surface (upper surface) of the pixel separation wall 304 parallel to the light receiving surface 10a, and crosstalk becomes more likely to occur.

Thus, in the present embodiment, as shown in FIG. 17, the width of the pixel separation wall 304 is thinned in the imaging element 100 in the central region of the pixel array section 30, where it is highly likely that crosstalk will occur in a mechanism like that described above. Further, in the present embodiment, the width of the pixel separation wall 304 is thickened in the imaging element 100 in the outer peripheral region of the pixel array section 30, where it is less likely that crosstalk will occur in a mechanism like that described above is low. In other words, in the present embodiment, the width of the pixel separation wall 304 in the imaging element 100 in the central region is thinner than the width of the pixel separation wall 304 in the imaging element 100 in the outer peripheral region. Thus, in the present embodiment, in the imaging element 100 in the central region, where the angle θ of incidence is small, the occurrence of crosstalk due to light being reflected by the surface (upper surface) of the pixel separation wall 304 parallel to the light receiving surface 10a can be suppressed. Further, in the present embodiment, in the imaging element 100 in the outer peripheral region, where it is less likely that crosstalk will occur in a similar mechanism, an event where a charge generated in the photoelectric conversion section 302 of one of the two pixels 300a and 300b flows into the other pixel can be suppressed, and the accuracy (separation ratio) of phase difference detection can be improved.

12. SUMMARY

As described hereinabove, in each embodiment of the present disclosure, in the imaging element (first imaging element) 100 that absorbs red light, in a case where the imaging element 100 is viewed from the light receiving surface 10a side, the slit 312 is provided in a portion in the vicinity of the center of the imaging element 100 of the pixel separation wall 304 that separates the two pixels 300a and 300b. Thus, in these embodiments, in the imaging element 100 that absorbs red light and generates a charge, an event where light incident on the vicinity of the center of the imaging element 100 is irregularly reflected by the pixel separation wall 304 and is incident on an adjacent imaging element 100 can be suppressed. As a result, in these embodiments, in the imaging elements 100 that absorb red light and blue light, crosstalk can be avoided, and eventually degradation of a captured image can be suppressed.

Further, in each embodiment of the present disclosure, it is presumed that in the imaging element (second imaging element) 100 that absorbs green light, irregular reflection like that described above is less likely to occur; therefore, in a case where the imaging element 100 is viewed from the light receiving surface 10a side, the slit 312 is not provided in the pixel separation wall 304 that separates the two pixels 300a and 300b. Thus, in these embodiments, in the imaging element 100 that absorbs light having a green wavelength component and generates a charge, an event where a charge generated in the photoelectric conversion section 302 of one of the two pixels 300a and 300b flows into the other pixel can be suppressed, and hence the separation ratio of pixels 300a and 300b can be improved. As a result, in these embodiments, in the imaging element 100 that absorbs light having a green wavelength component, the accuracy of phase difference detection is improved, and the occurrence of point defects on a captured image due to variations in charge inflow can be suppressed.

That is, in each embodiment of the present disclosure, by a configuration in which pixel separation walls 304 having forms according to the difference in characteristics of light due to the difference in wavelength are provided individually for imaging elements 100, degradation of a captured image can be avoided while the accuracy of phase difference detection is improved.

Note that although the above embodiments of the present disclosure describe application to a back-side illumination CMOS image sensor structure, the embodiment of the present disclosure is not limited thereto, and may be applied to other structures.

Note that although the above embodiments of the present disclosure describe an imaging element 100 in which the first conductivity type is an N-type, the second conductivity type is a P-type, and an electron is used as a signal charge, the embodiment of the present disclosure is not limited to such an example. For example, the present embodiment may be applied to an imaging element 100 in which the first conductivity type is a P-type, the second conductivity type is an N-type, and a hole is used as a signal charge.

Further, in the above embodiments of the present disclosure, the semiconductor substrate 10 may not necessarily be a silicon substrate, and may be another substrate (for example, a silicon-on-insulator (SOI) substrate, a SiGe substrate, or the like). Further, the semiconductor substrate 10 may be a structure in which a semiconductor structure or the like is formed on any of such various substrates.

Further, the imaging apparatus 1 according to the embodiment of the present disclosure is not limited to an imaging apparatus in which a distribution of amounts of incident visible light is sensed and captured as an image. For example, the present embodiment may be applied to an imaging apparatus in which a distribution of amounts of incident infrared rays, X-rays, particles, or the like is captured as an image or an imaging apparatus (physical quantity distribution sensing apparatus) such as a fingerprint detection sensor in which a distribution of another physical quantity such as pressure or capacitance is sensed and captured as an image.

Further, the imaging apparatus 1 according to the embodiment of the present disclosure can be manufactured by using a method, an apparatus, and conditions used for manufacturing a common semiconductor apparatus. That is, the imaging apparatus 1 according to the present embodiment can be manufactured by using an existing semiconductor apparatus manufacturing process.

Note that examples of the above method include a physical vapor deposition (PVD) method, a chemical vapor deposition (CVD) method, an atomic layer deposition (ALD) method, and the like. Examples of the PVD method include a vacuum vapor deposition method, an electron beam (EB) vapor deposition method, various sputtering methods (a magnetron sputtering method, a radio frequency (RF)-direct current (DC) coupled bias sputtering method, an electron cyclotron resonance (ECR) sputtering method, a counter target sputtering method, a high frequency sputtering method, and the like), an ion plating method, a laser ablation method, a molecular beam epitaxy (MBE) method, and a laser transfer method. Further, examples of the CVD method include a plasma CVD method, a thermal CVD method, an organic metal (MO) CVD method, and a photo CVD method. Further, other methods include an electrolytic plating method, an electroless plating method, and a spin coating method; an immersion method; a cast method; a micro-contact printing method; a drop cast method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Further, examples of the patterning method include chemical etching such as a shadow mask, laser transfer, and photolithography, and physical etching using ultraviolet rays, a laser, or the like. In addition, examples of the planarization technology include a chemical mechanical polishing (CMP) method, a laser planarization method, a reflow method, and the like.

13. APPLICATION EXAMPLE TO CAMERA

Figure 18:
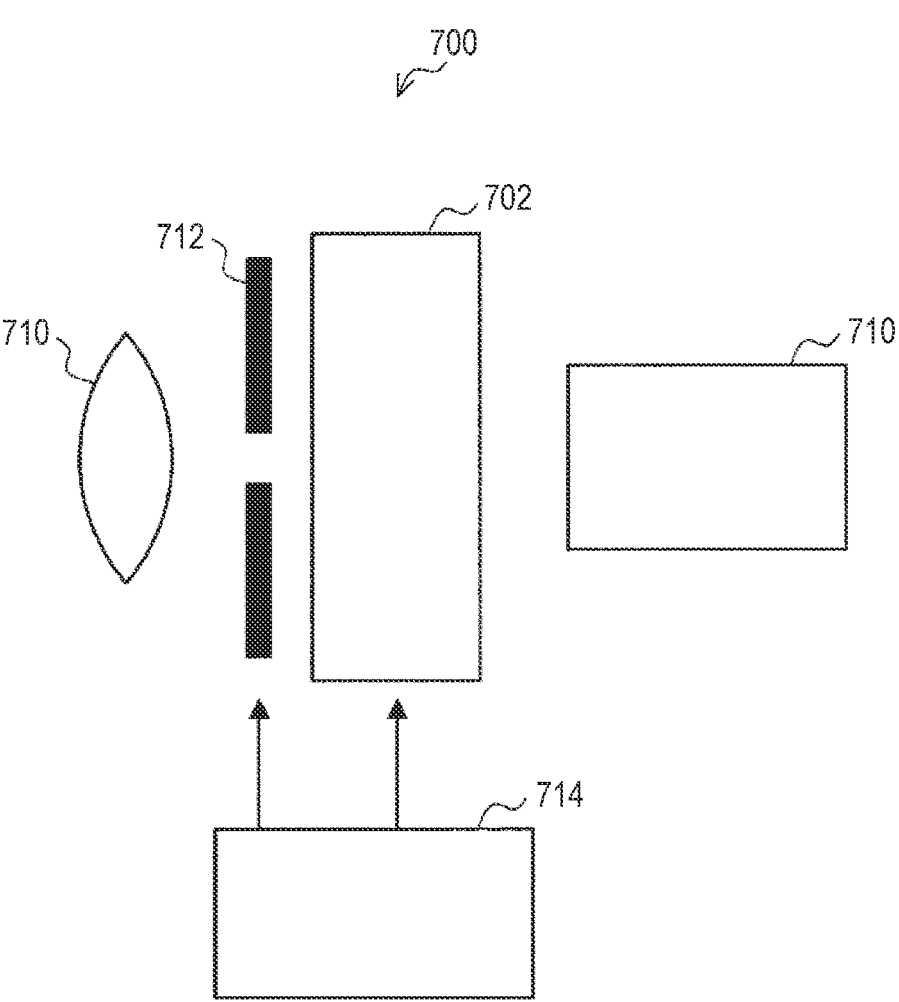
FIG. 18 is an explanatory diagram showing an example of a schematic functional configuration of a camera.

The technology according to the present disclosure (the present technology) can be further applied to various products. For example, the technology according to the present disclosure may be applied to a camera or the like. Thus, a configuration example of a camera 700 as an electronic device to which the present technology is applied will now be described with reference to FIG. 18. FIG. 18 is an explanatory diagram showing an example of a schematic functional configuration of a camera 700 to which the technology according to the present disclosure (the present technology) can be applied.

As shown in FIG. 18, the camera 700 includes an imaging apparatus 702, an optical lens 710, a shutter mechanism 712, a drive circuit unit 714, and a signal processing circuit unit 716. The optical lens 710 causes image light (incident light) from a subject to be formed as an image on an imaging surface of the imaging apparatus 702. Thus, signal charges are accumulated in the imaging element 100 of the imaging apparatus 702 for a certain period of time. The shutter mechanism 712 performs opening or closing to control the period of light irradiation and the period of light blocking for the imaging apparatus 702. The drive circuit unit 714 supplies drive signals that control a signal transfer operation of the imaging apparatus 702, a shutter operation of the shutter mechanism 712, etc. to these components. That is, the imaging apparatus 702 performs signal transfer on the basis of a drive signal (timing signal) supplied from the drive circuit unit 714. The signal processing circuit unit 716 performs various pieces of signal processing. For example, the signal processing circuit unit 716 outputs a video signal subjected to signal processing to a storage medium (illustration omitted) such as a memory or to a display section (illustration omitted), for example.

14. APPLICATION EXAMPLE TO SMARTPHONE

Figure 19:
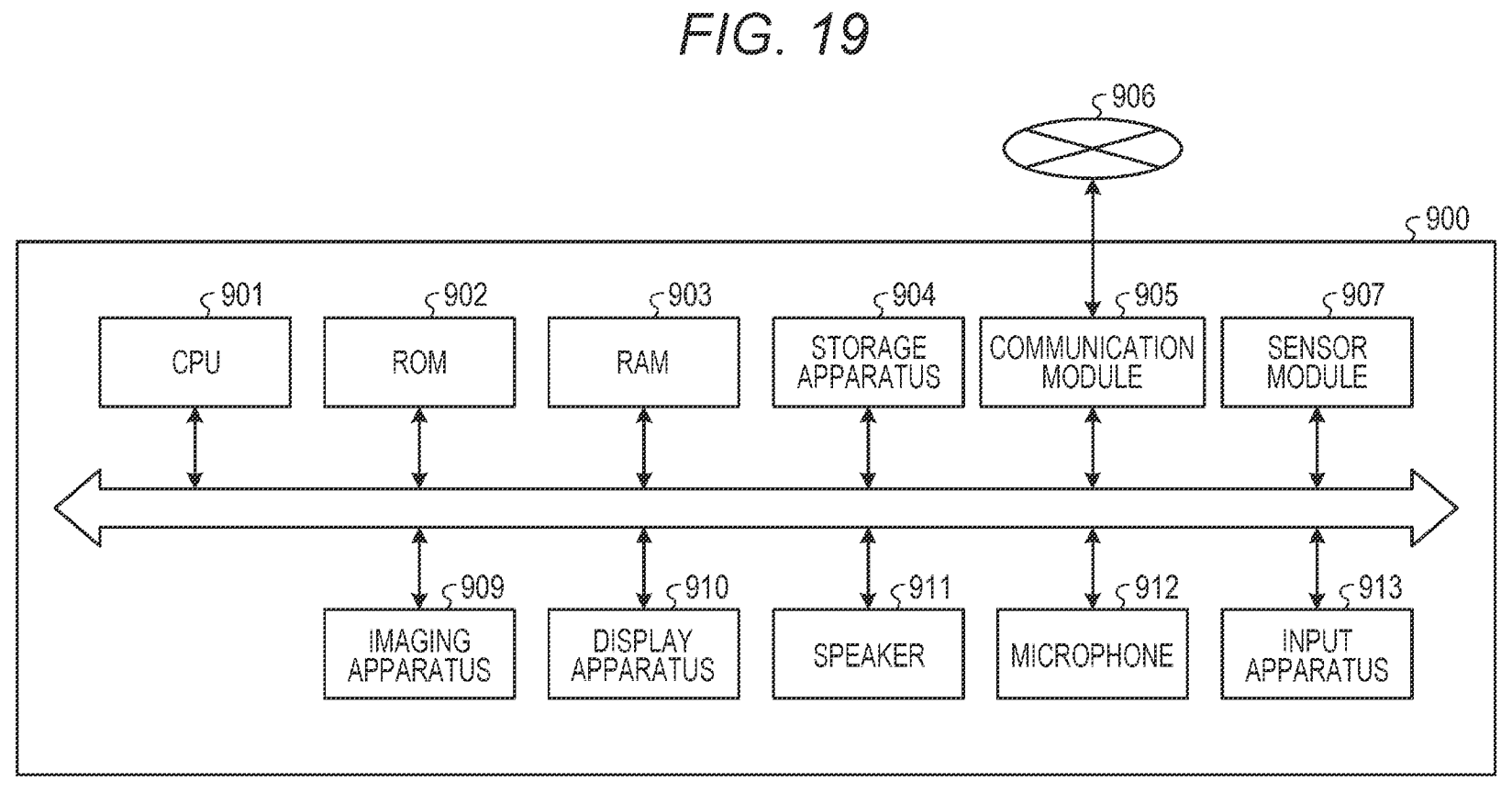

The technology according to the present disclosure (the present technology) can be further applied to various products. For example, the technology according to the present disclosure can be applied to a smartphone or the like. Therefore, a configuration example of the smartphone 900 as an electronic device to which the present technology is applied will be described with reference to FIG. 19. FIG. 19 is a view depicting an example of a schematic functional configuration of the smartphone 900 to which the technology according to an embodiment of the present disclosure (present technology) can be applied.

As illustrated in FIG. 19, the smartphone 900 includes a central processing unit (CPU) 901, a read only memory (ROM) 902, and a random access memory (RAM) 903. In addition, the smartphone 900 includes a storage apparatus 904, a communication module 905, and a sensor module 907. Furthermore, the smartphone 900 includes an imaging apparatus 909, a display apparatus 910, a speaker 911, a microphone 912, an input apparatus 913, and a bus 914. The smartphone 900 may include a processing circuit such as a digital signal processor (DSP), alternatively or in addition to the CPU 901.

The CPU 901 serves as an arithmetic processing apparatus and a control apparatus, and controls the overall operation or a part of the operation of the smartphone 900 according to various programs recorded in the ROM 902, the RAM 903, or the storage apparatus 904, or the like. The ROM 902 stores programs, operation parameters, and the like used by the CPU 901. The RAM 903 primarily stores programs used in execution by the CPU 901, and various parameters and the like that change as appropriate when executing such programs. The CPU 901, the ROM 902, and the RAM 903 are connected to one another by the bus 914. Further, the storage apparatus 904 is an apparatus for data storage that is an example of a storage unit of the smartphone 900. The storage apparatus 904 includes, for example, a magnetic storage device such as a hard disk drive (HDD), a semiconductor storage device, an optical storage device, or the like. The storage apparatus 904 stores therein various data and the programs executed by the CPU 901, for example, various data acquired from an outside, and the like.

The communication module 905 is a communication interface including, for example, a communication device for connection to a communication network 906. The communication module 905 may be, for example, a communication card or the like for a wired or wireless local area network (LAN), Bluetooth (registered trademark), Wi-Fi, or a wireless USB (WUSB). Further, the communication module 905 may also be a router for optical communication, a router for asymmetric digital subscriber line (ADSL), a modem for various types of communication, or the like. For example, the communication module 905 transmits and receives signals or the like in the Internet or transmits and receives signals or the like to and from another communication device by using a predetermined protocol such as TCP/IP. Further, the communication network 906 connected to the communication module 905 is a network established through wired or wireless connection. The communication network 906 may include, for example, the Internet, a home LAN, infrared communication, satellite communication, or the like.

The sensor module 907 includes, for example, various sensors such as motion sensors (for example, an acceleration sensor, a gyro sensor, a geomagnetic sensor, etc.), biological information sensors (for example, a pulse sensor, a blood pressure sensor, a fingerprint sensor, etc.), or position sensors (for example, a global navigation satellite system (GNSS) receiver, etc.).

The imaging apparatus 909 is provided on the front surface of the smartphone 900, and can image an object or the like located on the back surface side or the front side of the smartphone 900. Specifically, the imaging apparatus 909 may include an imaging element (illustration omitted) such as a complementary MOS (CMOS) image sensor to which the technology according to the present disclosure (the present technology) can be applied and a signal processing circuit (illustration omitted) that performs imaging signal processing on a signal photoelectrically converted in the imaging element. Further, the imaging apparatus 909 may further include an optical system mechanism (illustration omitted) including an imaging lens, a diaphragm mechanism, a zoom lens, a focus lens, etc. and a drive system mechanism (illustration omitted) that controls the operation of the optical system mechanism. Then, the imaging element condenses incident light from an object as an optical image, and the signal processing circuit photoelectrically converts the formed optical image in units of pixels, reads out a signal of each pixel as an imaging signal, and performs image processing; thus, a captured image can be acquired.

The display apparatus 910 is provided on the front surface of the smartphone 900, and may be, for example, a display apparatus such as a liquid crystal display (LCD) or an organic electro-luminescence (EL) display. The display apparatus 910 can display an operation screen, a captured image acquired by the imaging apparatus 909 described above, etc.

The speaker 911 can output, for example, a call voice, a voice accompanying video content displayed by the display apparatus 910 described above, etc. to the user.

The microphone 912 can collect, for example, a call voice of the user, a voice including a command that starts up a function of the smartphone 900, and sounds in the surrounding environment of the smartphone 900.

The input apparatus 913 is a device operated by a user such as a button, a keyboard, a touch panel, and a mouse, for example. The input apparatus 913 includes an input control circuit that generates input signals on the basis of information which is input by a user to output the generated input signals to the CPU 901. A user inputs various types of data to the smartphone 900 and instructs the smartphone 900 to perform a processing operation by operating the input apparatus 913.

The configuration example of the smartphone 900 has been described above. Each of the configuration elements described above may include a general purpose component or may include hardware specialized for the function of each of the configuration elements. The configuration may be changed as necessary in accordance with the state of the art at the time of working of the present disclosure.

15. APPLICATION EXAMPLE TO ENDOSCOPIC SURGERY SYSTEM

The technology according to the present disclosure (the present technology) can be further applied to various products. For example, the technology according to the present disclosure can be applied to the endoscopic surgery system.

Figure 20:
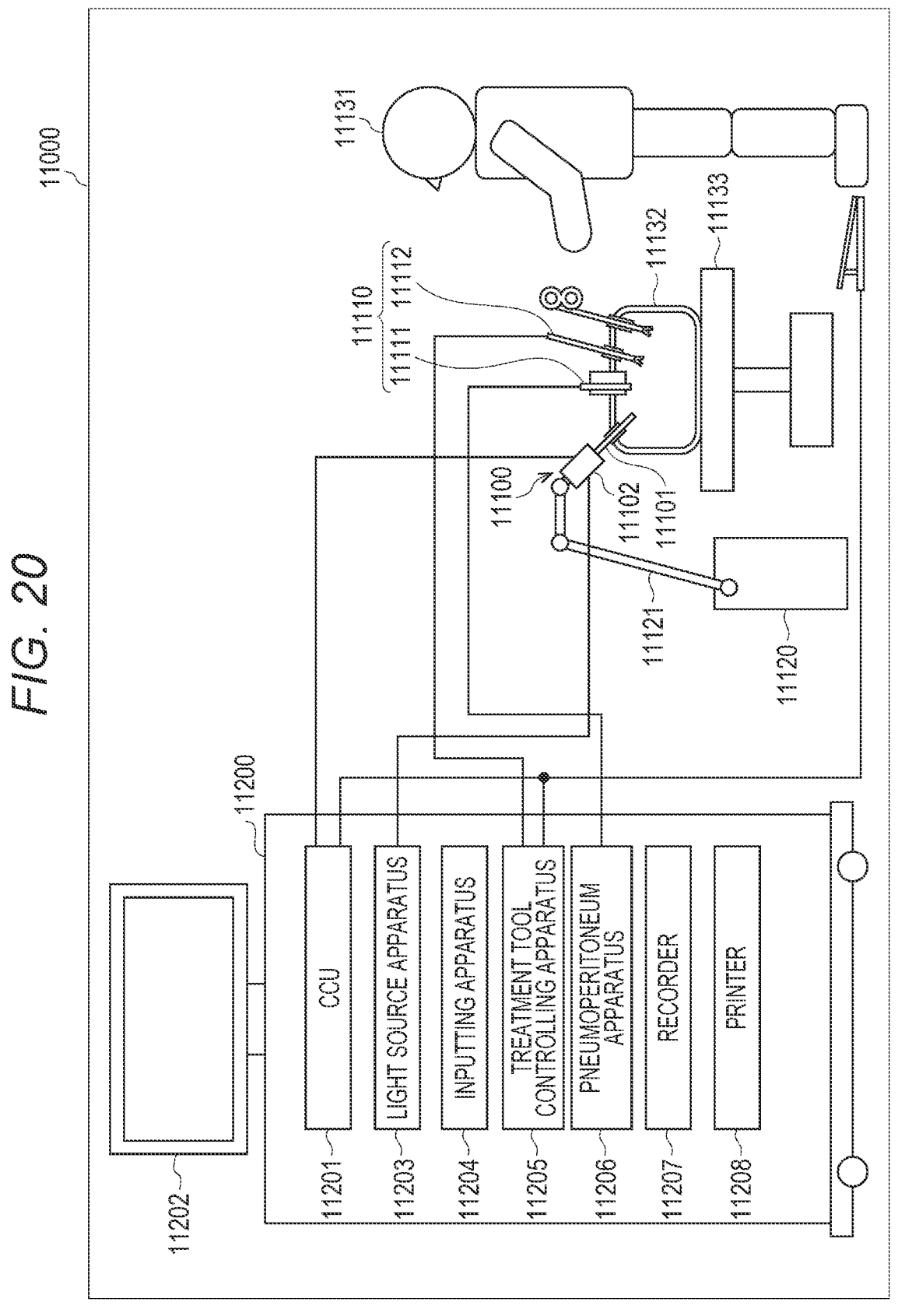
FIG. 20 is a view depicting an example of a schematic configuration of an endoscopic surgery system.

FIG. 20 is a view showing an example of a schematic configuration of an endoscopic surgery system to which the technology according to an embodiment of the present disclosure (present technology) can be applied.

In FIG. 20, a state is illustrated in which a surgeon (medical doctor) 11131 is using an endoscopic surgery system 11000 to perform surgery for a patient 11132 on a patient bed 11133. As illustrated, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example illustrated, the endoscope 11100 is illustrated which includes as a rigid endoscope having the lens barrel 11101 of the hard type. However, the endoscope 11100 may otherwise be included as a flexible endoscope having the lens barrel of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an imaging element are provided in the inside of the camera head 11102 such that reflected light (observation light) from the observation target is condensed on the imaging element by the optical system. The observation light is photo-electrically converted by the imaging element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image capturing condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumo-peritoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a captured image can be performed by the light source apparatus 11203. Further, in this case, if laser beams from the respective RGB laser light sources are irradiated time-divisionally on an observation target and driving of the imaging elements of the camera head 11102 are controlled in synchronism with the irradiation timings. Then images individually corresponding to the R, G and B colors can be also captured time-divisionally. According to this method, a color image can be obtained even if color filters are not provided for the imaging element.

Further, the light source apparatus 11203 may be controlled such that the intensity of light to be outputted is changed for each predetermined time. By controlling driving of the imaging element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 21:
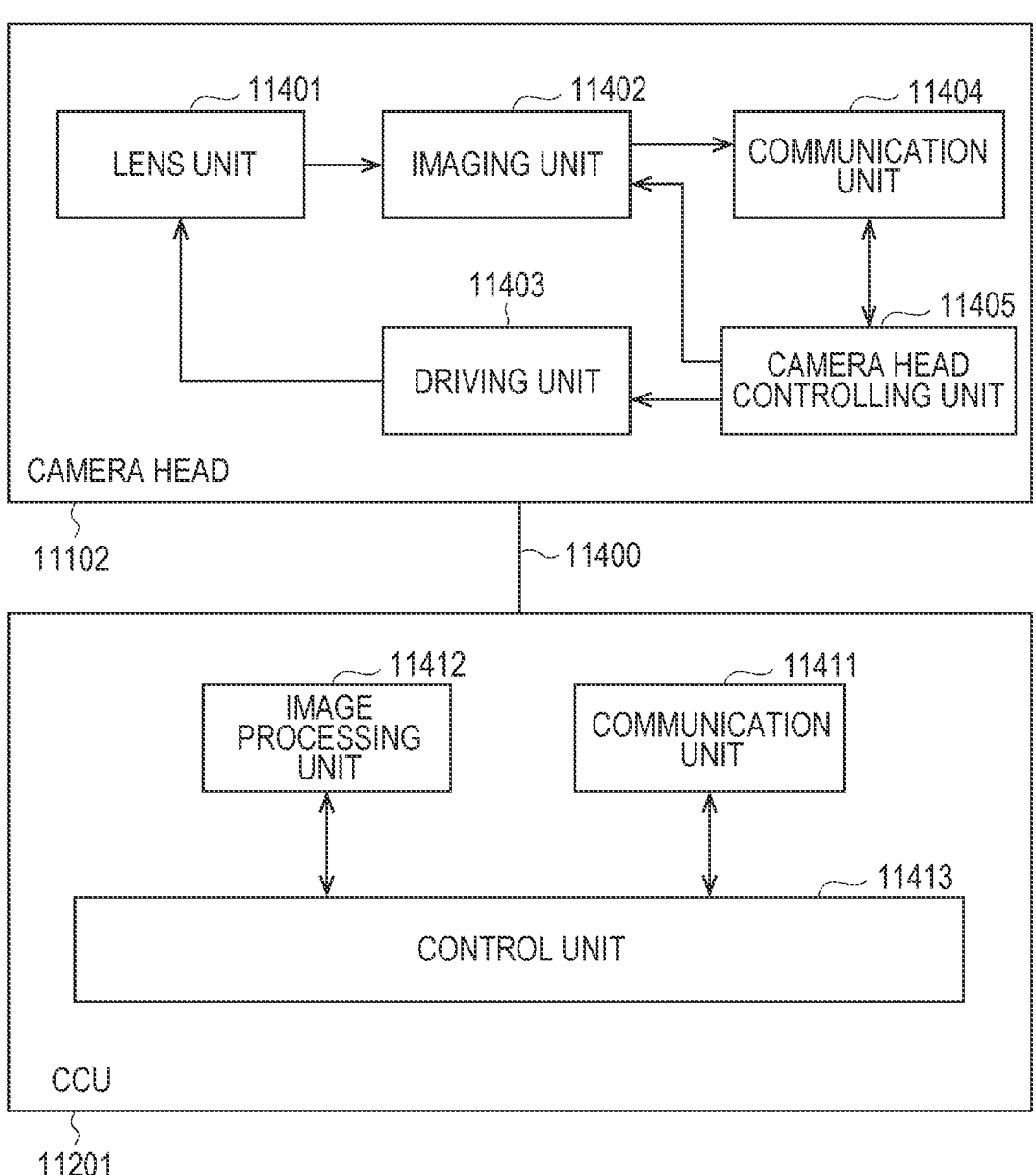
FIG. 21 is a block diagram depicting an example of a functional configuration of a camera head and a CCU.

FIG. 21 is a block diagram showing an example of a functional configuration of the camera head 11102 and the CCU 11201 illustrated in FIG. 20.

The camera head 11102 includes a lens unit 11401, an imaging unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The imaging unit 11402 includes imaging elements. The number of imaging elements which is included by the imaging unit 11402 may be one (single-plate type) or a plural number (multi-plate type). Where the imaging unit 11402 is configured as that of the multi-plate type, for example, image signals corresponding to respective R, G and B are generated by the imaging elements, and the image signals may be synthesized to obtain a color image. The imaging unit 11402 may also be configured so as to have a pair of imaging elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the imaging unit 11402 is configured as that of stereoscopic type, a plurality of systems of lens units 11401 is provided corresponding to the individual imaging elements.

Further, the imaging unit 11402 may not necessarily be provided on the camera head 11102. For example, the imaging unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a captured image by the imaging unit 11402 can be adjusted suitably.

The communication unit 11404 includes a communication apparatus for transmitting and receiving various kinds of information to and from the CCU 11201. The communication unit 11404 transmits an image signal acquired from the imaging unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image capturing conditions such as, for example, information that a frame rate of a captured image is designated, information that an exposure value upon image capturing is designated and/or information that a magnification and a focal point of a captured image are designated.

It is to be noted that the image capturing conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image capturing of a surgical region or the like by the endoscope 11100 and display of a captured image obtained by image capturing of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a captured image in which the surgical region or the like is imaged. Thereupon, the control unit 11413 may recognize various objects in the captured image using various image recognition technologies. For example, the control unit 11413 can recognize a surgical tool such as forceps, a particular living body region, bleeding, mist when the energy device 11112 is used and so forth by detecting the shape, color and so forth of edges of objects included in a captured image. The control unit 11413 may cause, when it controls the display apparatus 11202 to display a captured image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example illustrated, communication is performed by wired communication using the transmission cable 11400, the communication between the camera head 11102 and the CCU 11201 may be performed by wireless communication.

Hereinabove, an example of an endoscopic surgery system to which the technology according to the present disclosure can be applied is described. The technology according to the present disclosure can be applied to, of the configuration described above, for example, the endoscope 11100, (the imaging unit 11402 of) the camera head 11102, (the image processing unit 11412 of) the CCU 11201, or the like.

Note that, although the endoscopic surgery system has been described as an example herein, the technology according to the present disclosure may also be applied to others, for example, a microscope surgery system, and the like.

16. APPLICATION EXAMPLE TO MOBILE BODIES

The technology according to the present disclosure (present technology) can be applied to various products. For example, the technology according to the present disclosure may be implemented as apparatuses mounted on any type of mobile bodies such as automobiles, electric vehicles, hybrid electric vehicles, motorcycles, bicycles, personal mobilities, airplanes, drones, ships, and robots.

Figure 22:
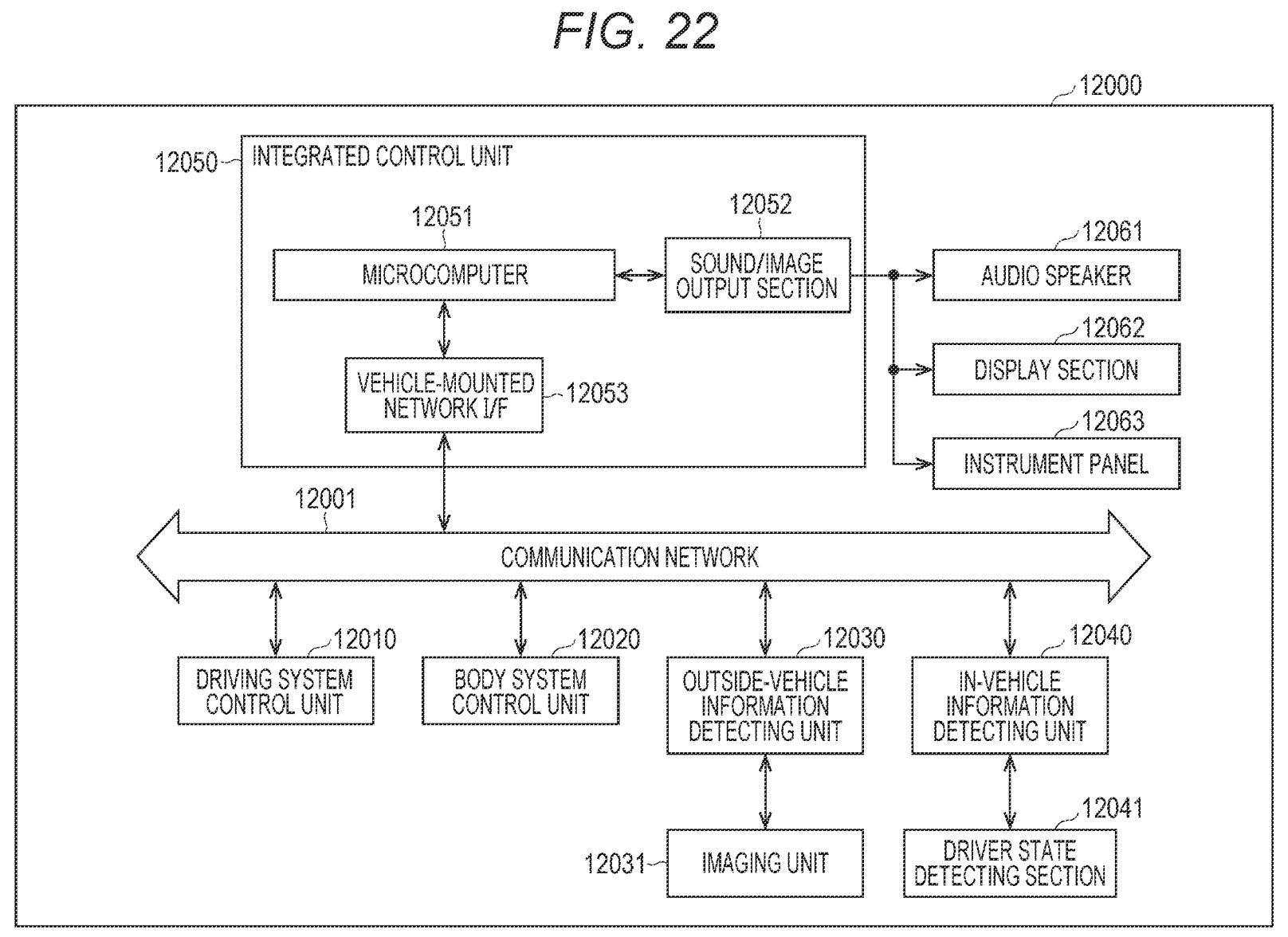

FIG. 22 is a block diagram showing an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example illustrated in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display or a head-up display.

Figure 23:
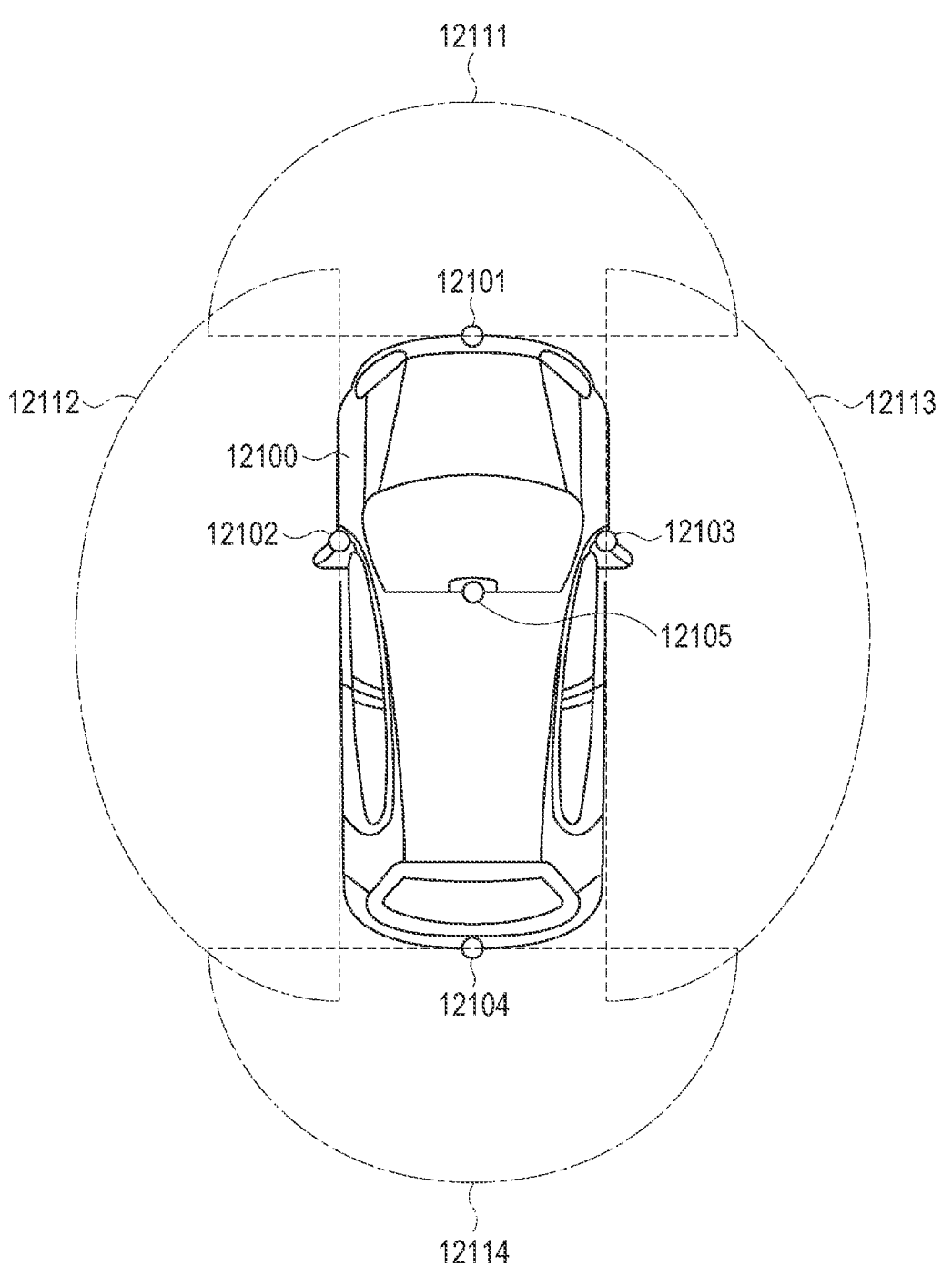
FIG. 23 is a diagram of assistance in explaining an example of installation positions of an outside-vehicle information detecting section and an imaging section.

FIG. 23 is a diagram showing an example of the installation position of the imaging unit 12031.

In FIG. 23, the vehicle 12100 includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. The imaging units 12101 and 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 illustrates an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in captured images of the imaging units 12101 to 12104. Such recognition of a pedestrian is, for example, performed by a procedure of extracting characteristic points in the captured images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the captured images of the imaging units 12101 to 12104, and thus recognizes the pedestrian, the sound/image output section 12052 controls the display section 12062 so that a square contour line for emphasis is displayed so as to be superimposed on the recognized pedestrian. Furthermore, the sound/image output section 12052 may also control the display section 12062 so that an icon or the like representing the pedestrian is displayed at a desired position.

Hereinabove, an example of a vehicle control system to which the technology according to the present disclosure can be applied is described. The technology according to the present disclosure can be applied to, of the configuration described above, for example, the imaging unit 12031 or the like.

17. SUPPLEMENTS

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

An imaging apparatus including:

a first imaging element and a second imaging element each of which converts light to a charge, in which each of the first and second imaging elements includes:

a plurality of pixels that is provided in a semiconductor substrate and is adjacent to each other;

34 a pixel separation wall that separates adjacent ones of the plurality of pixels; and a color filter that is provided above a light receiving surface of the semiconductor substrate and transmits light having a wavelength that is different between the first imaging element and the second imaging element, the pixel separation wall included in the first imaging element has a slit at a center of the first imaging element in a case where the imaging apparatus is viewed from a side of the light receiving surface, and the pixel separation wall included in the second imaging element does not have a slit at a center of the second imaging element in a case where the imaging apparatus is viewed from a side of the light receiving surface.

(2)

The imaging apparatus according to (1), in which each of the first and second imaging elements includes the two pixels.

(3)

The imaging apparatus according to (1), in which each of the first and second imaging elements includes the four pixels.

(4)

The imaging apparatus according to any one of (1) to (3), in which each of the first and second imaging elements further includes an element separation wall that surrounds the plurality of pixels included in each of the first and second imaging elements and separates adjacent imaging elements.

(5)

The imaging apparatus according to (4), in which the pixel separation wall and the element separation wall are provided to penetrate from the light receiving surface to an intermediate place of the semiconductor substrate along a thickness direction of the semiconductor substrate, and a depth of the pixel separation wall with respect to the light receiving surface is shallower than a depth of the element separation wall.

(6)

The imaging apparatus according to (4), in which the pixel separation wall is provided to penetrate from the light receiving surface to an intermediate place of the semiconductor substrate along a thickness direction of the semiconductor substrate, and the element separation wall is provided to penetrate the semiconductor substrate along a thickness direction of the semiconductor substrate.

(7)

The imaging apparatus according to (5) or (6), in which a depth of the pixel separation wall of the first imaging element with respect to the light receiving surface is deeper than a depth of the pixel separation wall of the second imaging element.

(8)

The imaging apparatus according to any one of (4) to (7), in which a width of the pixel separation wall is thinner than a width of the element separation wall in a case where the imaging apparatus is viewed from a side of the light receiving surface.

35

(9)

The imaging apparatus according to any one of (1) to (8), further including a third imaging element that converts light to a charge, in which the third imaging element includes:

the plurality of pixels that is provided in the semiconductor substrate and is adjacent to each other;

the pixel separation wall that separates adjacent ones of the plurality of pixels; and the color filter that is provided above the light receiving surface of the semiconductor substrate and transmits light having a wavelength different from wavelengths of light that the color filters of the first and second imaging elements transmit.

(10)

The imaging apparatus according to (9), in which the pixel separation wall included in the third imaging element has a slit at a center of the third imaging element in a case where the imaging apparatus is viewed from a side of the light receiving surface.

(11)

The imaging apparatus according to (9), in which the pixel separation wall included in the third imaging element does not have a slit at a center of the third imaging element in a case where the imaging apparatus is viewed from a side of the light receiving surface.

(12)

The imaging apparatus according to any one of (9) to (11), in which the third imaging element further includes an element separation wall that surrounds the plurality of pixels included in the third imaging element and separates adjacent imaging elements, and in the third imaging element, the pixel separation wall and the element separation wall are provided to penetrate from the light receiving surface to an intermediate place of the semiconductor substrate along a thickness direction of the semiconductor substrate, and a depth of the pixel separation wall with respect to the light receiving surface is shallower than a depth of the element separation wall.

(13)

The imaging apparatus according to any one of (9) to (11), in which the third imaging element further includes an element separation wall that surrounds the plurality of pixels included in the third imaging element and separates adjacent imaging elements, and in the third imaging element, the pixel separation wall is provided to penetrate from the light receiving surface to an intermediate place of the semiconductor substrate along a thickness direction of the semiconductor substrate, and the element separation wall is provided to penetrate the semiconductor substrate along a thickness direction of the semiconductor substrate.

(14)

The imaging apparatus according to (12) or (13), in which a depth of the pixel separation wall of the third imaging element with respect to the light receiving surface is shallower than a depth of the pixel separation wall of the second imaging element.

(15)

The imaging apparatus according to any one of (1) to (14), in which

36 the imaging apparatus includes a light receiving section including a plurality of imaging elements arranged in a matrix form on the light receiving surface of the semiconductor substrate, and a depth of the pixel separation wall with respect to the light receiving surface in the imaging element in a central region of the light receiving section is shallower than a depth of the pixel separation wall in the imaging element in an outer peripheral region of the light receiving section.

(16)

The imaging apparatus according to any one of (1) to (15), in which the imaging apparatus includes a light receiving section including the plurality of imaging elements arranged in a matrix form on the light receiving surface of the semiconductor substrate, and a width of the pixel separation wall in the imaging element in a central region of the light receiving section is thinner than a width of the pixel separation wall in the imaging element in an outer peripheral region of the light receiving section in a case where the imaging apparatus is viewed from a side of the light receiving surface.

(17)

An electronic device including:

an imaging apparatus including a first imaging element and a second imaging element each of which converts light to a charge, in which each of the first and second imaging elements includes:

a plurality of pixels that is provided in a semiconductor substrate and is adjacent to each other;

a pixel separation wall that separates adjacent ones of the plurality of pixels; and a color filter that is provided above a light receiving surface of the semiconductor substrate and transmits light having a wavelength that is different between the first imaging element and the second imaging element, the pixel separation wall included in the first imaging element has a slit at a center of the first imaging element in a case where the imaging apparatus is viewed from a side of the light receiving surface, and the pixel separation wall included in the second imaging element does not have a slit at a center of the second imaging element in a case where the imaging apparatus is viewed from a side of the light receiving surface.

REFERENCE SIGNS LIST

1 Imaging apparatus
10 Semiconductor substrate
10a Light receiving surface
10b Front surface
30 Pixel array section
32 Vertical drive circuit unit
34 Column signal processing circuit unit
36 Horizontal drive circuit unit
38 Output circuit unit
40 Control circuit unit
42 Pixel drive wiring
44 Vertical signal line
46 Horizontal signal line
48 Input and output terminal

100, 100*a* Imaging element
200 On-chip lens
202 Color filter
204 Light blocking section
300, 300*a*, 300*b*, 300*c*, 300*d* Pixel
302 Photoelectric conversion section
304 Pixel separation wall
310 Element separation wall
400*a*, 400*b* Transfer gate

What is claimed is:

1. An imaging apparatus, comprising:
a first imaging element and a second imaging element
   each of which converts light to a charge,
wherein each of the first and second imaging elements
   includes:
a plurality of pixels that is provided in a semiconductor
   substrate;
an element separation wall that surrounds the plurality of
   pixels included in each of the first and second imaging
   elements and separates adjacent imaging elements;
a pixel separation wall that separates adjacent ones of the
   plurality of pixels; and
a color filter that is provided above a light receiving
   surface of the semiconductor substrate,
wherein the color filter included in the first imaging
   element transmits light having a first wavelength,
wherein the pixel separation wall included in the first
   imaging element has a slit at a center of the first
   imaging element in a case where the imaging apparatus
   is viewed from a side of the light receiving surface,
wherein the color filter included in the second imaging
   element transmits light having a second wavelength
   that is different than the first wavelength,
wherein the pixel separation wall included in the second
   imaging element extends continuously between a por-
   tion of the element separation wall disposed on a first
   side of the second imaging element and a portion of the
   element separation wall disposed on a second side of
   the second imaging element that is opposite the first
   side of the second imaging element, and
wherein the pixel separation wall included in the second
   imaging element does not have a slit at a center of the
   second imaging element in a case where the imaging
   apparatus is viewed from a side of the light receiving
   surface.
2. The imaging apparatus according to claim 1, wherein
each of the first and second imaging elements includes
   two pixels.
3. The imaging apparatus according to claim 1, wherein
each of the first and second imaging elements includes
   four pixels.
4. The imaging apparatus according to claim 1, wherein
the pixel separation wall and the element separation wall
   are provided to penetrate from the light receiving
   surface to an intermediate place of the semiconductor
   substrate along a thickness direction of the semicon-
   ductor substrate, and
a depth of the pixel separation wall with respect to the
   light receiving surface is shallower than a depth of the
   element separation wall.
5. The imaging apparatus according to claim 1, wherein
the pixel separation wall is provided to penetrate from the
   light receiving surface to an intermediate place of the
   semiconductor substrate along a thickness direction of
   the semiconductor substrate, and the element separation wall is provided to penetrate the
   semiconductor substrate along a thickness direction of
   the semiconductor substrate.
6. The imaging apparatus according to claim 4, wherein a
depth of the pixel separation wall of the first imaging
element with respect to the light receiving surface is deeper
than a depth of the pixel separation wall of the second
imaging element.
7. The imaging apparatus according to claim 1, wherein a
width of the pixel separation wall is thinner than a width of
the element separation wall in a case where the imaging
apparatus is viewed from a side of the light receiving
surface.
8. The imaging apparatus according to claim 1,
further comprising a third imaging element that converts
   light to a charge,
wherein the third imaging element
includes:
the plurality of pixels that is provided in the semiconduc-
   tor substrate and is adjacent to each other;
the pixel separation wall that separates adjacent ones of
   the plurality of pixels; and
the color filter that is provided above the light receiving
   surface of the semiconductor substrate and transmits
   light having a wavelength different from wavelengths
   of light that the color filters of the first and second
   imaging elements transmit.
9. The imaging apparatus according to claim 8, wherein
the pixel separation wall included in the third imaging
element has a slit at a center of the third imaging element in
a case where the imaging apparatus is viewed from a side of
the light receiving surface.
10. The imaging apparatus according to claim 8, wherein
the pixel separation wall included in the third imaging
element does not have a slit at a center of the third imaging
element in a case where the imaging apparatus is viewed
from a side of the light receiving surface.
11. The imaging apparatus according to claim 8, wherein
the third imaging element
further includes an element separation wall that surrounds
   the plurality of pixels included in the third imaging
   element and separates adjacent imaging elements, and
in the third imaging element,
the pixel separation wall and the element separation wall
   are provided to penetrate from the light receiving
   surface to an intermediate place of the semiconductor
   substrate along a thickness direction of the semicon-
   ductor substrate, and
a depth of the pixel separation wall with respect to the
   light receiving surface is shallower than a depth of the
   element separation wall.
12. The imaging apparatus according to claim 8, wherein
the third imaging element
further includes an element separation wall that surrounds
   the plurality of pixels included in the third imaging
   element and separates adjacent imaging elements, and
in the third imaging element,
the pixel separation wall is provided to penetrate from the
   light receiving surface to an intermediate place of the
   semiconductor substrate along a thickness direction of
   the semiconductor substrate, and
the element separation wall is provided to penetrate the
   semiconductor substrate along a thickness direction of
   the semiconductor substrate.
13. The imaging apparatus according to claim 11, wherein
a depth of the pixel separation wall of the third imaging element with respect to the light receiving surface is shallower than a depth of the pixel separation wall of the second imaging element.

14. The imaging apparatus according to claim 1, wherein the imaging apparatus includes a light receiving section including a plurality of imaging elements arranged in a matrix form on the light receiving surface of the semiconductor substrate, and a depth of the pixel separation wall with respect to the light receiving surface in the imaging element in a central region of the light receiving section is shallower than a depth of the pixel separation wall in the imaging element in an outer peripheral region of the light receiving section.

15. The imaging apparatus according to claim 1, wherein the imaging apparatus includes a light receiving section including the plurality of imaging elements arranged in a matrix form on the light receiving surface of the semiconductor substrate, and a width of the pixel separation wall in the imaging element in a central region of the light receiving section is thinner than a width of the pixel separation wall in the imaging element in an outer peripheral region of the light receiving section in a case where the imaging apparatus is viewed from a side of the light receiving surface.

16. An electronic device, comprising:

an imaging apparatus including a first imaging element and a second imaging element each of which converts light to a charge, wherein each of the first and second imaging elements includes:

a plurality of pixels that is provided in a semiconductor substrate;

an element separation wall that surrounds the plurality of pixels included in each of the first and second imaging elements and separates adjacent imaging elements;

a pixel separation wall that separates adjacent ones of the plurality of pixels; and a color filter that is provided above a light receiving surface of the semiconductor substrate, wherein the color filter included in the first imaging element transmits light having a first wavelength, wherein the pixel separation wall included in the first imaging element has a slit at a center of the first imaging element in a case where the imaging apparatus is viewed from a side of the light receiving surface, wherein the color filter included in the second imaging element transmits light having a second wavelength that is different than the first wavelength, wherein the pixel separation wall included in the second imaging element extends continuously between a portion of the element separation wall disposed on a first side of the second imaging element and a portion of the element separation wall disposed on a second side of the second imaging element that is opposite the first side of the second imaging element, and wherein the pixel separation wall included in the second imaging element-does not have a slit at a center of the second imaging element in a case where the imaging apparatus is viewed from a side of the light receiving surface.

17. The imaging apparatus according to claim 1, wherein the color filter included in the first imaging element transmits light of a first color, and wherein the color filter included in the second imaging element transmits light of a second color.

18. The imaging apparatus according to claim 1, wherein the color filter included in the first imaging element transmits light having a red wavelength component or a blue wavelength component, and wherein the color filter included in the second imaging element transmits light having a red wavelength component.

* * * * *